(12) United States Patent
Kanasugi et al.

(10) Patent No.: US 6,493,844 B1
(45) Date of Patent: Dec. 10, 2002

(54) ERROR DETECTOR, SEMICONDUCTOR DEVICE, AND ERROR DETECTION METHOD

(75) Inventors: Masami Kanasugi, Kawasaki (JP); Shoji Taniguchi, Kawasaki (JP); Koichi Kuroiwa, Yokohama (JP); Mahiro Hikita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/311,722

(22) Filed: May 14, 1999

(30) Foreign Application Priority Data

Dec. 9, 1998 (JP) .......................................... 10-350008

(51) Int. Cl.[7] ............................................. H03M 13/00
(52) U.S. Cl. ..................................................... 714/781
(58) Field of Search ................................. 714/781, 785

(56) References Cited

U.S. PATENT DOCUMENTS

| | | | | |
|---|---|---|---|---|
| 3,811,108 A | * | 5/1974 | Howell ........................ | 714/785 |
| 3,961,311 A | * | 6/1976 | Pavoni et al. ................ | 714/775 |
| 4,916,702 A | | 4/1990 | Berlekamp ................. | 371/39.1 |
| RE33,900 E | * | 4/1992 | Howson ..................... | 370/514 |
| 5,136,592 A | * | 8/1992 | Weng .......................... | 714/762 |
| 5,140,595 A | * | 8/1992 | Geldman et al. ........... | 714/762 |
| 5,680,340 A | * | 10/1997 | Glover et al. ............... | 708/492 |

FOREIGN PATENT DOCUMENTS

| | | | | |
|---|---|---|---|---|
| EP | 0 200 124 A2 | * | 4/1986 | .......... H03M/13/00 |
| EP | 0 200 124 A | | 11/1986 | |
| EP | 0 523 571 A | | 1/1993 | |
| EP | 0 551 646 A2 | * | 7/1993 | ............. H04L/1/00 |

OTHER PUBLICATIONS

Stephen B. Wicker "Error Control Systems for Digital Communication and Storage", Prentice–Hall, 1995.*
Copy of the International Search Report for Application No. EP 99 10 9434; Date of Search: Apr. 18, 2001; Examiner: C. Devergranne.

* cited by examiner

*Primary Examiner*—Albert Decady
*Assistant Examiner*—Joseph D. Torres
(74) *Attorney, Agent, or Firm*—Arent Fox Kintner Plotkin Kahn

(57) ABSTRACT

An error detector at a receiver comprises a feedback shift register. A shift direction in the feedback shift register is opposite to a shift direction at a transmitter in generating a transmission bit string by using a specified generator polynomial. A reception bit string is inputted to the feedback shift register in reverse order to the transmission bit string generated at the transmitter so that errors in the reception bit string are detected by obtaining the remainder. Another error detector at a receiver comprises first and second feedback shift registers. Respective shift directions in the first and second feedback shift registers are the same as and opposite to a shift direction at a transmitter in generating a transmission bit string. The reception bit string is inputted to the first feedback shift register in the same order in which the transmission bit string was generated, while the reception bit string is inputted to the second feedback shift register in reverse order to one which the transmission bit string was generated. Errors in the reception bit string are detected by comparing respective remainders obtained by the first and second feedback shift registers. This reduces the processing time required for the error detection and increases efficiency in detecting errors in transmitted data.

7 Claims, 31 Drawing Sheets

Prior Art

Fig. 4 registers value — shift direction → (initial value at state 0)

| state | DIN2 | DOUT2 | X15 | X14 | X13 | X12 | X11 | X10 | X9 | X8 | X7 | X6 | X5 | X4 | X3 | X2 | X1 | X0 |
|---|---|---|---|---|---|---|---|---|---|---|---|---|---|---|---|---|---|---|
| 0 | — | — | 0 | 0 | 0 | 0 | 0 | 0 | 0 | 0 | 0 | 0 | 0 | 0 | 0 | 0 | 0 | 0 |
| 1 | 0 | — | 0 | 0 | 0 | 0 | 0 | 0 | 0 | 0 | 0 | 0 | 0 | 0 | 0 | 0 | 0 | 0 |
| 2 | 1 | — | 0 | 0 | 0 | 0 | 0 | 0 | 0 | 0 | 0 | 0 | 0 | 0 | 0 | 0 | 0 | 1 |
| 3 | 0 | — | 0 | 0 | 0 | 0 | 0 | 0 | 0 | 0 | 0 | 0 | 0 | 0 | 0 | 0 | 1 | 0 |
| 4 | 1 | — | 0 | 0 | 0 | 0 | 0 | 0 | 0 | 0 | 0 | 0 | 0 | 0 | 0 | 1 | 0 | 1 |
| 5 | 0 | — | 0 | 0 | 0 | 0 | 0 | 0 | 0 | 0 | 0 | 0 | 0 | 0 | 1 | 0 | 1 | 0 |
| 6 | 1 | — | 0 | 0 | 0 | 0 | 0 | 0 | 0 | 0 | 0 | 0 | 0 | 1 | 0 | 1 | 0 | 1 |
| 7 | 0 | — | 0 | 0 | 0 | 0 | 0 | 0 | 0 | 0 | 0 | 0 | 1 | 0 | 1 | 0 | 1 | 0 |
| 8 | 1 | — | 0 | 0 | 0 | 0 | 0 | 0 | 0 | 0 | 0 | 1 | 0 | 1 | 0 | 1 | 0 | 1 |
| 9 | 0 | — | 0 | 0 | 0 | 0 | 0 | 0 | 0 | 0 | 1 | 0 | 1 | 0 | 1 | 0 | 1 | 0 |
| 10 | 0 | — | 0 | 0 | 0 | 0 | 0 | 0 | 0 | 1 | 0 | 1 | 0 | 1 | 0 | 1 | 0 | 0 |
| 11 | 0 | — | 0 | 0 | 0 | 0 | 0 | 0 | 1 | 0 | 1 | 0 | 1 | 0 | 1 | 0 | 0 | 0 |
| 12 | 0 | — | 0 | 0 | 0 | 0 | 0 | 1 | 0 | 1 | 0 | 1 | 0 | 1 | 0 | 0 | 0 | 0 |
| 13 | 1 | — | 0 | 0 | 0 | 0 | 1 | 0 | 1 | 0 | 1 | 0 | 1 | 0 | 0 | 0 | 0 | 1 |
| 14 | 0 | — | 0 | 0 | 0 | 1 | 0 | 1 | 0 | 1 | 0 | 1 | 0 | 0 | 0 | 0 | 1 | 0 |
| 15 | 0 | — | 0 | 0 | 1 | 0 | 1 | 0 | 1 | 0 | 1 | 0 | 0 | 0 | 0 | 1 | 0 | 0 |
| 16 | 0 | — | 0 | 1 | 0 | 1 | 0 | 1 | 0 | 1 | 0 | 0 | 0 | 0 | 1 | 0 | 0 | 0 |
| 17 | 1 | — | 1 | 0 | 1 | 0 | 1 | 0 | 1 | 0 | 0 | 0 | 0 | 1 | 0 | 0 | 0 | 1 |
| 18 | 0 | — | 0 | 1 | 0 | 1 | 0 | 1 | 0 | 0 | 0 | 0 | 1 | 0 | 0 | 0 | 1 | 0 |
| 19 | 1 | — | 1 | 0 | 1 | 0 | 1 | 0 | 0 | 0 | 0 | 1 | 0 | 0 | 0 | 1 | 0 | 1 |
| 20 | 0 | — | 0 | 1 | 0 | 1 | 0 | 0 | 0 | 0 | 1 | 0 | 0 | 0 | 1 | 0 | 1 | 0 |
| 21 | 0 | — | 0 | 0 | 1 | 0 | 0 | 0 | 0 | 1 | 0 | 0 | 0 | 1 | 0 | 1 | 0 | 0 |
| 22 | 0 | — | 0 | 0 | 0 | 0 | 0 | 0 | 0 | 0 | 0 | 0 | 0 | 0 | 0 | 0 | 0 | 0 |

| state | DIN1 | DOUT1 | X15 | X14 | X13 | X12 | X11 | X10 | X9 | X8 | X7 | X6 | X5 | X4 | X3 | X2 | X1 | X0 |
|---|---|---|---|---|---|---|---|---|---|---|---|---|---|---|---|---|---|---|
| 6 | 1 | 1 | 0 | 1 | 1 | 1 | 1 | 0 | 1 | 0 | 1 | 1 | 1 | 0 | 1 | 0 | 0 | 0 |
| 7 | 0 | 0 | 1 | 1 | 1 | 1 | 0 | 1 | 0 | 1 | 1 | 1 | 0 | 1 | 0 | 0 | 0 | 0 |
| 8 | 0 | 1 | 1 | 1 | 1 | 0 | 1 | 0 | 1 | 1 | 1 | 0 | 1 | 0 | 0 | 0 | 0 | 0 |
| 9 | 0 | 1 | 1 | 1 | 0 | 1 | 0 | 1 | 1 | 1 | 0 | 1 | 0 | 0 | 0 | 0 | 0 | 0 |
| 10 | 0 | 1 | 1 | 0 | 1 | 0 | 1 | 1 | 1 | 0 | 1 | 0 | 0 | 0 | 0 | 0 | 0 | 0 |
| 11 | 0 | 0 | 0 | 1 | 0 | 1 | 1 | 1 | 0 | 1 | 0 | 0 | 0 | 0 | 0 | 0 | 0 | 0 |
| 12 | 0 | 1 | 1 | 0 | 1 | 1 | 1 | 0 | 1 | 0 | 0 | 0 | 0 | 0 | 0 | 0 | 0 | 0 |
| 13 | 0 | 0 | 0 | 1 | 1 | 1 | 0 | 1 | 0 | 0 | 0 | 0 | 0 | 0 | 0 | 0 | 0 | 0 |
| 14 | 0 | 1 | 1 | 1 | 1 | 0 | 1 | 0 | 0 | 0 | 0 | 0 | 0 | 0 | 0 | 0 | 0 | 0 |
| 15 | 0 | 1 | 1 | 1 | 0 | 1 | 0 | 0 | 0 | 0 | 0 | 0 | 0 | 0 | 0 | 0 | 0 | 0 |
| 16 | 0 | 1 | 1 | 0 | 1 | 0 | 0 | 0 | 0 | 0 | 0 | 0 | 0 | 0 | 0 | 0 | 0 | 0 |
| 17 | 0 | 0 | 0 | 1 | 0 | 0 | 0 | 0 | 0 | 0 | 0 | 0 | 0 | 0 | 0 | 0 | 0 | 0 |
| 18 | 0 | 1 | 1 | 0 | 0 | 0 | 0 | 0 | 0 | 0 | 0 | 0 | 0 | 0 | 0 | 0 | 0 | 0 |
| 19 | 0 | 0 | 0 | 0 | 0 | 0 | 0 | 0 | 0 | 0 | 0 | 0 | 0 | 0 | 0 | 0 | 0 | 0 |
| 20 | 0 | 0 | 0 | 0 | 0 | 0 | 0 | 0 | 0 | 0 | 0 | 0 | 0 | 0 | 0 | 0 | 0 | 0 |
| 21 | 0 | 0 | 0 | 0 | 0 | 0 | 0 | 0 | 0 | 0 | 0 | 0 | 0 | 0 | 0 | 0 | 0 | 0 |
| 22 | 0 | 0 | 0 | 0 | 0 | 0 | 0 | 0 | 0 | 0 | 0 | 0 | 0 | 0 | 0 | 0 | 0 | 0 | shift direction ↓ — registers value — check bit string (DOUT1 column, states 7–22)

Fig. 1 2

| state | DIN2 | X15 | X14 | X13 | X12 | X11 | X10 | X9 | X8 | X7 | X6 | X5 | X4 | X3 | X2 | X1 | X0 |
|---|---|---|---|---|---|---|---|---|---|---|---|---|---|---|---|---|---|
| 0 | — | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 0 | 0 |
| 2 | 0 | 0 | 0 | 0 | 0 | 0 | 0 | 0 | 0 | 0 | 0 | 0 | 0 | 0 | 0 | 0 | 0 |
| 3 | 0 | 0 | 0 | 0 | 0 | 0 | 0 | 0 | 0 | 0 | 0 | 0 | 0 | 0 | 0 | 0 | 0 |
| 4 | 1 | 1 | 0 | 0 | 0 | 0 | 0 | 0 | 0 | 0 | 0 | 0 | 0 | 0 | 0 | 0 | 0 |
| 5 | 0 | 0 | 1 | 0 | 0 | 0 | 0 | 0 | 0 | 0 | 0 | 0 | 0 | 0 | 0 | 0 | 0 |
| 6 | 1 | 1 | 0 | 1 | 0 | 0 | 0 | 0 | 0 | 0 | 0 | 0 | 0 | 0 | 0 | 0 | 0 |
| 7 | 1 | 1 | 1 | 0 | 1 | 0 | 0 | 0 | 0 | 0 | 0 | 0 | 0 | 0 | 0 | 0 | 0 |
| 8 | 1 | 1 | 1 | 1 | 0 | 1 | 0 | 0 | 0 | 0 | 0 | 0 | 0 | 0 | 0 | 0 | 0 |
| 9 | 0 | 0 | 1 | 1 | 1 | 0 | 1 | 0 | 0 | 0 | 0 | 0 | 0 | 0 | 0 | 0 | 0 |
| 10 | 1 | 1 | 0 | 1 | 1 | 1 | 0 | 1 | 0 | 0 | 0 | 0 | 0 | 0 | 0 | 0 | 0 |
| 11 | 0 | 0 | 1 | 0 | 1 | 1 | 1 | 0 | 1 | 0 | 0 | 0 | 0 | 0 | 0 | 0 | 0 |
| 12 | 1 | 1 | 0 | 1 | 0 | 1 | 1 | 1 | 0 | 1 | 0 | 0 | 0 | 0 | 0 | 0 | 0 |
| 13 | 1 | 1 | 1 | 0 | 1 | 0 | 1 | 1 | 1 | 0 | 1 | 0 | 0 | 0 | 0 | 0 | 0 |
| 14 | 1 | 1 | 1 | 1 | 0 | 1 | 0 | 1 | 1 | 1 | 0 | 1 | 0 | 0 | 0 | 0 | 0 |
| 15 | 1 | 1 | 1 | 1 | 1 | 0 | 1 | 0 | 1 | 1 | 1 | 0 | 1 | 0 | 0 | 0 | 0 |
| 16 | 0 | 0 | 1 | 1 | 1 | 1 | 0 | 1 | 0 | 1 | 1 | 1 | 0 | 1 | 0 | 0 | 0 |
| 17 | 1 | 1 | 0 | 1 | 1 | 1 | 1 | 0 | 1 | 0 | 1 | 1 | 1 | 0 | 1 | 0 | 0 |
| 18 | 0 | 0 | 1 | 0 | 1 | 1 | 1 | 1 | 0 | 1 | 0 | 1 | 1 | 1 | 0 | 1 | 0 |
| 19 | 1 | 1 | 0 | 1 | 0 | 1 | 1 | 1 | 1 | 0 | 1 | 0 | 1 | 1 | 1 | 0 | 1 |
| 20 | 0 | 1 | 1 | 0 | 1 | 0 | 1 | 1 | 1 | 1 | 0 | 1 | 0 | 1 | 1 | 1 | 0 |
| 21 | 1 | 1 | 1 | 1 | 0 | 1 | 0 | 1 | 1 | 1 | 1 | 0 | 1 | 0 | 1 | 1 | 1 |
| 22 | 0 | 1 | 1 | 1 | 1 | 1 | 1 | 1 | 1 | 1 | 1 | 1 | 1 | 1 | 1 | 1 | 1 |

Fig. 14

| state | DIN2 | X15 | X14 | X13 | X12 | X11 | X10 | X9 | X8 | X7 | X6 | X5 | X4 | X3 | X2 | X1 | X0 |
|---|---|---|---|---|---|---|---|---|---|---|---|---|---|---|---|---|---|
| 0 | — | 1 | 1 | 1 | 1 | 1 | 1 | 1 | 1 | 1 | 1 | 1 | 1 | 1 | 1 | 1 | 1 |
| 1 | 0 | 1 | 1 | 1 | 1 | 1 | 1 | 1 | 1 | 1 | 1 | 0 | 1 | 1 | 1 | 1 | 1 |
| 2 | 1 | 0 | 1 | 0 | 0 | 1 | 1 | 1 | 1 | 1 | 0 | 1 | 0 | 1 | 0 | 1 | 0 |
| 3 | 0 | 1 | 0 | 1 | 0 | 0 | 1 | 1 | 1 | 1 | 1 | 0 | 1 | 0 | 1 | 0 | 1 |
| 4 | 1 | 0 | 1 | 0 | 1 | 1 | 0 | 0 | 0 | 0 | 1 | 0 | 1 | 1 | 1 | 1 | 0 |
| 5 | 0 | 1 | 0 | 1 | 0 | 1 | 1 | 0 | 0 | 0 | 0 | 1 | 0 | 1 | 1 | 1 | 1 |
| 6 | 1 | 0 | 1 | 1 | 1 | 1 | 1 | 1 | 1 | 1 | 1 | 1 | 0 | 0 | 0 | 0 | 0 |
| 7 | 0 | 1 | 0 | 1 | 1 | 1 | 1 | 1 | 1 | 1 | 1 | 1 | 1 | 0 | 0 | 0 | 0 |
| 8 | 0 | 1 | 1 | 0 | 1 | 0 | 0 | 0 | 0 | 0 | 1 | 0 | 1 | 1 | 1 | 1 | 0 |
| 9 | 0 | 1 | 1 | 1 | 0 | 1 | 0 | 0 | 0 | 0 | 0 | 1 | 0 | 1 | 1 | 1 | 1 |
| 10 | 0 | 1 | 0 | 1 | 1 | 1 | 1 | 1 | 1 | 1 | 1 | 1 | 0 | 0 | 0 | 0 | 0 |
| 11 | 0 | 0 | 1 | 0 | 1 | 1 | 1 | 0 | 1 | 1 | 0 | 0 | 0 | 0 | 0 | 0 | 0 |
| 12 | 0 | 1 | 0 | 1 | 0 | 1 | 0 | 1 | 0 | 0 | 0 | 0 | 0 | 0 | 0 | 0 | 0 |
| 13 | 0 | 0 | 1 | 1 | 1 | 0 | 1 | 0 | 0 | 0 | 0 | 0 | 0 | 0 | 0 | 0 | 0 |
| 14 | 0 | 1 | 0 | 0 | 1 | 1 | 0 | 1 | 0 | 0 | 0 | 0 | 0 | 0 | 0 | 0 | 0 |
| 15 | 0 | 1 | 1 | 1 | 0 | 1 | 0 | 0 | 0 | 0 | 0 | 0 | 0 | 0 | 0 | 0 | 0 |
| 16 | 0 | 0 | 1 | 1 | 1 | 0 | 1 | 0 | 0 | 0 | 0 | 0 | 0 | 0 | 0 | 0 | 0 |
| 17 | 0 | 1 | 0 | 0 | 1 | 1 | 0 | 1 | 0 | 0 | 0 | 0 | 0 | 0 | 0 | 0 | 0 |
| 18 | 0 | 0 | 1 | 1 | 0 | 0 | 1 | 0 | 0 | 0 | 0 | 0 | 0 | 0 | 0 | 0 | 0 |
| 19 | 0 | 0 | 0 | 1 | 1 | 0 | 0 | 0 | 0 | 0 | 0 | 0 | 0 | 0 | 0 | 0 | 0 |
| 20 | 0 | 0 | 0 | 0 | 1 | 1 | 0 | 0 | 0 | 0 | 0 | 0 | 0 | 0 | 0 | 0 | 0 |
| 21 | 0 | 0 | 0 | 0 | 0 | 1 | 0 | 0 | 0 | 0 | 0 | 0 | 0 | 0 | 0 | 0 | 0 |
| 22 | 0 | 0 | 0 | 0 | 0 | 0 | 0 | 0 | 0 | 0 | 0 | 0 | 0 | 0 | 0 | 0 | 0 |

ERROR DETECTOR, SEMICONDUCTOR DEVICE, AND ERROR DETECTION METHOD

BACKGROUND OF THE INVENTION

1. Field of the Invention

The present invention relates to a detection of errors in data and, more particularly, to an error detector for detecting errors that occur in data under transmission.

The present invention relates to a semiconductor device comprising the error detector.

The present invention relates to an error detection method for detecting errors that occur in data under transmission.

2. Description of the Related Art

There are various factors which may cause errors in data being transmitted via transmission lines. For the detecting the errors, a transmitter in a communication system adds check data, under a given rule, to target data to be transmitted. A receiver in the communication system examines whether or not the transmitted data is in accordance with the rule and judges whether or not there are the presence of errors based on the result of the detection.

Out of error detection methods, the most prevalent one is a CRC (Cyclic Redundancy Check) method using a cyclic code. In the CRC error detection, the transmitter splits the target data to be transmitted into information bit strings of a specified length, represents each of the information bit strings in a polynomial, and divides it by a generator polynomial. The transmitter then generates the cyclic code by adding, as check bits, a remainder from the division to the information bit string and transmits the cyclic code to the receiver.

The receiver divides the received cyclic code by the same generator polynomial used at the transmitter to judge whether or not the presence of errors depending on whether or not the cyclic code is divisible.

FIG. 1 shows an exemplary communication system that performs the error detection by using the cyclic code. In the communication system, a transmitter 1, and a receiver 2 are connected to each other via a radio transmission line 3. The transmitter 1 and the receiver 2 correspond to, e.g., a base station and a mobile terminal for mobile communication such as a mobile phone, respectively.

The transmitter 1 has a coder 4 for coding data to be transmitted and a data modulating/transmitting unit 5 for modulating the coded data and outputting the modulated data to the radio transmission line 3. The coder 4 is composed of a feedback shift register 6.

The receiver 2 has a data receiving/demodulating unit 7 for receiving the data transmitted via the radio transmission line 3 and demodulating the received data, and an error detector 8 for detecting errors in the demodulated data. The error detector 8 is composed of a feedback shift register 9 and an right/wrong output unit 10 for outputting an error detecting signal FLAG. The error detector 8 has been formed in a semiconductor device SEM with other communication functional elements.

As shown in FIG. 2, the feedback shift register 6 and the feedback shift register 9 are composed of identical circuits such as dividers conforming to a sixteenth-degree generator polynomial $X^{16}+X^{12}+X^5+1$.

Each of the feedback shift registers 6 and 9 has a register unit 11 consisting of flip-flop circuits X15 to X0 (hereinafter referred to as F/F circuits X15 to X0) connected in cascade, three EOR (Exclusive OR) circuits 12a, 12b, and 12c, and switches S1 and S2. In the register unit 11, a shift direction has been set such that data is shifted from the F/F circuit X0 to the F/F circuit X15. A clock signal CLK is connected to the clock terminal of each of the F/F circuits X15 to X0 such that shift operations are performed in synchronization.

The EOR circuit 12a receives an output of the F/F circuit X15 and an input signal DIN1 (or DIN2) and outputs the result of the operation to the F/F circuit X0. The EOR circuit 12b receives the output of the EOR circuit 12a and an output of the F/F circuit X11 and outputs the result of the operation to the F/F circuit X12. The EOR circuit 12c receives the output of the EOR circuit 12a and an output of the F/F circuit X4 and outputs the result of the operation to the F/F circuit X5.

The switch S1 is for selectively connecting the output of the F/F circuit X15 or the input signals DIN1 and DIN2 to the output signals DOUT1 and DOUT2 of the feedback shift registers 6 and 9. The switch 2 is for feeding back the output of the EOR circuit 12a to the EOR circuits 12b and 12c and to the F/F circuit X0.

In the communication system shown in FIG. 1, the transmitter 1 performs coding and the receiver 2 performs the error detection as follows. By way of example, the following description will be given to the case where a 6-bit information bit string "01 0101" is transmitted.

FIG. 3 shows the respective states of the F/F circuits X15 to X0 when the feedback shift register 6 at the transmitter 1 is operated. Upon each receipt of the clock signal CLK, the feedback shift register 6 shifts the values held by the F/F circuits X15 to X0 to the left in the drawing, so that "STATE" is incremented by 1 upon each receipt of the clock signal CLK. That is, the individual F/F circuits X15 to X0 undergo transitions from "STATE 0" to "STATE 6" when viewed in the columnar direction.

In "STATE 0", each of the F/F circuits X15 to X0 is reset to "0".

In "STATE 1" through "STATE 6" shown in FIG. 2, the switch S1 is switched to connect the input signal DIN1 to the output signal DOUT, and the switch 2 is closed. Consequently, the information bit string "01 0101" inputted from the input signal DIN1 is inputted to the feedback shift register 6 and outputted simultaneously to the output signal DOUT1.

The information bit string outputted to the output signal DOUT1 is modulated by the data modulating/transmitting unit 5 and then transmitted to the receiver 2 via the radio transmission line 3.

When the feedback shift register 6 has operated to reach "STATE 6", the values "0100 0010 0001 0100" held by the respective F/F circuits X15 to X0 form a check bit string and the cyclic code "01 0101 0100 0010 0001 0100" enclosed in the bold rectangle of FIG. 3 are generated from the information bit string and the check bit string.

An output of the check bit string is performed by operating the feedback shift register 6 and sequentially outputting the values held by the F/F circuits X15 to X0 in "STATE 6" to the output signal DOUT1. At this time, the switch S1 is switched to connect the output of the F/F circuit X15 to the output signal DOUT1, and the switch S2 is open. By opening the switch S2, a "0" is inputted to each of the F/F circuit X0 and the EOR circuits 12b and 12c.

The check bit string outputted to the output signal DOUT1 is modulated by the data modulating/transmitting unit 5 and then transmitted to the receiver 2 via the radio transmission line 3.

The data receiving/demodulating unit 7 at the receiver 2 receives the modulated cyclic code (information bit string+ check bit string) and sequentially demodulates it to the original cyclic code. The data receiving/demodulating unit 7 inputs the individual bits of the cyclic code to the feedback shift register 9 of the error detector 8 in the order in which they were demodulated.

FIG. 4 shows the respective states of the individual F/F circuits X15 to X0 when the feedback shift register 9 of the error detector 8 is operated. It is to be noted that FIG. 4 shows the operation when the received cyclic code has no error.

In "STATE 0", each of the F/F circuits X15 to X0 is reset to "0". In "STATE 1" through "STATE 22", the switch S2 of FIG. 2 is closed. The switch S1 may be switched to either side.

The feedback shift register 9 sequentially receives the cyclic code "01 0101 0100 0010 0001 0100" from the input signal DIN2. In "STATE 22" in which the cyclic code has been received up to the least significant bit (hereinafter referred to as LSB) thereof, the values held by the F/F circuits X15 to X0, i.e., the value of the remainder obtained by dividing the received cyclic code by the generator polynomial, is "0" when the received data is error-free.

Whether or not the remainder is "0" is verified by the right/wrong output unit 10 of FIG. 1. Therefore, the feedback shift register 9 sequentially outputs the values held by the F/F circuits X15 to X0 in "STATE 22" to the output signal DOUT2. At this time, the switch S1 is switched to connect the output of the F/F circuit X15 to the output signal DOUT2, while the switch S2 is open.

The right/wrong output unit 10 sequentially receives from the output signal DOUT2 a 16-bit value, which is the remainder from the division, performs a logical NOR operation with respect to each bit of the received value, and outputs the result of the operation to the error detecting signal FLAG. Accordingly, a "1" is outputted to the error detecting signal FLAG if the received cyclic code is correct. If the received cyclic code is erroneous, on the other hand, some of the values held by the F/F circuits X15 to X0 in "STATE 22" shown in FIG. 4 are nonzero. Therefore, a "0" is outputted to the error detecting signal FLAG as a result of the NOR operation performed with respect to each of the values held by the F/F circuits X15 to X0. If the error detecting signal FLAG is "0", the receiver 2 discards the received data or gives a retransmission instruction to the transmitter 1.

By thus using the cyclic code, the communication system described above detects errors that have occurred on the data on the radio transmission line 3.

In general, communication systems perform not only the error detection but also the error correction for transmitted data. As an error correcting code for use in the error correction, a block code such as the cyclic code and a convolutional code are known. Since the radio transmission line used in mobile communication or the like has highly variable characteristics depending on geographical features and weather conditions and a burst error due to fading is likely to occur, the convolutional code effective in correcting the burst error is used frequently.

FIG. 5 shows an exemplary communication system that performs the error correction by using the convolutional code. In the communication system, the transmitter 1 has the coder 4, a convolutional coder 13, and the data modulating/transmitting unit 5 which are connected in series, and the receiver 2 has the data receiving/demodulating unit 7, a Viterbi decoder 14, a data processing unit 15, and the error detector 8 which are connected in series. In FIG. 5, the same components as used in FIG. 1 are designated by similar reference numerals.

In the communication system shown in FIG. 5, the detection and correction of errors in data transmitted from the transmitter 1 are performed at the receiver 2.

First, the coder 4 at the transmitter 1 obtains a check bit string from an information bit string to generate a cyclic code and sequentially outputs the cyclic code to the output signal DOUT1 having the information bit string side as the most significant bit (hereinafter referred to as MSB).

The convolutional coder 13 sequentially receives the cyclic code from the MSB side, generates the convolutional code, and outputs the code to the data modulating/transmitting unit 5. The data modulating/transmitting unit 5 modulates the convolutional code and outputs the modulated convolutional code onto the radio transmission line 3.

The data transmitting/demodulating unit 7 at the receiver 2 sequentially receives the modulated convolutional code, demodulates the code to the original convolutional code, and outputs it to the Viterbi decoder 14.

The Viterbi decoder 14 decodes the received convolutional code to the original cyclic code. During decoding, the Viterbi decoder corrects the burst error or the like that has occurred on the radio transmission line 3 to recover the original correct bit string. In the Viterbi decoder 14, the cyclic code is sequentially decoded from the LSB side and outputted.

Next, the cyclic code outputted from the LSB side is sequentially loaded into the data processing unit 15 and, after the reception is completed, the loaded cyclic code is outputted from the MSB side to the input signal DIN2 of the feedback shift register 9. Thereafter, the error detection is performed similarly to that performed by the communication system of FIG. 1 described above and the result of the detection is outputted as the error detecting signal FLAG.

To perform the error detection at the receiver 2 in the communication system shown in FIG. 1, all the bits of the cyclic code should be inputted bit by bit to the error detector 8. If the information bit string has considerable bit length, an increased processing time is required for the error detection, leading to the problem that the error detection process cannot be performed efficiently.

In the communication system shown in FIG. 5, the Viterbi decoder 1 at the receiver 2 decodes the cyclic code from the LSB side. The feedback shift register 9 receives the cyclic code from the MSB side to perform the error detection. Consequently, the receiver 2 cannot output the cyclic code sequentially decoded by the Viterbi decoder 14 directly to the feedback shift register 9.

As a result, the entire cyclic code should preliminarily be inputted from the LSB side to the data processing unit 15 and, after the decoding process by the Viterbi decoder 14 is completed, the cyclic code is finally outputted from the MSB side to the feedback shift register 9.

This causes the problems of the processing time extending from the decoding process to the error detection increasing and the circuit scale increasing.

The increased circuit scale further causes the problem that the chip size of the semiconductor device SEM increases when the error detector 8 has been formed into the semiconductor device SEM.

Since the error detection cannot be performed efficiently, there is the possibility that data transmission efficiency in the communication system is lowered.

SUMMARY OF THE INVENTION

It is an object of the present invention, having been made in order to solve the problems described above, to provide an error detector and an error detection method wherein the processing time for error detection can be reduced and errors in transmitted data can be detected efficiently.

Another object of the present invention is to provide a semiconductor device comprising the error detector wherein the error detection can be performed efficiently without increasing the chip size.

Still another object of the present invention is to provide a communication system wherein the error detection can be performed without lowering the efficiency of data transmission on a transmission line.

In the error detector according to the present invention, a feedback shift register for dividing a reception bit string by a generator polynomial is so constructed that a shift direction and a feedback direction in obtaining a remainder thereby are opposite to a shift direction and a feedback direction at a transmitter in generating a transmission bit string by using a specified generator polynomial. Accordingly, the reception bit string is sequentially divided to generate the remainder by inputting the reception bit string to the feedback shift register in reverse order to the transmission bit string was generated at the transmitter. Errors in the reception bit string are detected based on the remainder. This reduces processing time required for the error detection and provides efficient error detection process in the case where the reception bit string is inputted in reverse order to the order the transmission bit string was generated at the transmitter.

In one of the aspects of the present invention, in the error detector, the feedback shift register also comprises: a register unit having stages equal in number to the highest degree of the specified generator polynomial; the first operation unit for performing an operation between an input value to the register unit and an output value from the final stage and outputting a result of the operation to the first stage; and the second operation unit for performing an operation between the output value from the final stage and an output value from the stage equal in number to the degree of each of the terms of the specified generator polynomial other than the highest-degree and lowest-degree terms and outputting a result of the operation to the next stage. Accordingly, the value of the register unit of the feedback shift register in each state is changed to the direction that returns the check bit string generated by the feedback shift register at the transmitter to an initial value, by causing the feedback shift register to perform shift operations and inputting the reception bit string thereto in reverse order of the transmission bit string generated. As a result, the reception bit string can be judged to be erroneous if the value of the register unit when the feedback shift register has performed a specified number of shift operations does not coincide with the initial value of the feedback shift register at the transmitter.

In another aspect of the present invention, the error detector comprises comparing unit for comparing the remainder obtained by the feedback shift register with a predetermined expected value and outputting error data indicative of the dissimilarity as a result of the comparison. This result of the comparison performed by the comparing unit allows easy the error detection. The remainder may be compared bit by bit with the expected value, while causing the feedback shift register performs shift operations, or alternatively, all the bits of the remainder may be compared at a time with the expected value by constructing the feedback shift register such that the generated remainder is outputted in parallel.

In yet another aspect of the present invention, the error detector comprises an initializing unit for initializing the register unit of the feedback shift register. This allows initialization of the register unit without causing the feedback shift register to perform shift operations. As a result, the register unit is loaded with the remainder (check bit string) of the reception bit string, which was generated at the transmitter, by merely causing the feedback shift register to perform shift operations after the initialization. The reason why the reception of the check bit string by the register unit is possible by mere shift operations is that each of the first and second operation units has an input connected to the final stage of the register unit. When the register unit is initialized, therefore, data inputted to the feedback shift register is sequentially loaded therein till it makes a complete circulation around the register unit.

In still another aspect of the present invention, the error detector comprises a specified value setting unit for setting a specified value to the register unit of the feedback shift register. The arrangement allows the remainder (check bit string) obtained at the transmitter to be loaded simultaneously into the register unit without causing the feedback shift register to perform shift operations.

In another aspect of the present invention, the error detector comprises the first and second feedback shift registers. The shift direction and the feedback direction in the first feedback shift register are the same as the shift direction and the feedback direction at a transmitter in generating a transmission bit string by using a specified generator polynomial. A shift direction and a feedback direction in the second feedback shift register are opposite to the shift direction and feedback direction at the transmitter in generating the transmission bit string by using the specified generator polynomial. The first feedback shift register generates a remainder by receiving a reception bit string in the same order in which the transmission bit string was generated at the transmitter and dividing the reception bit string. The second feedback shift register generates a remainder by receiving the reception bit string in reverse order to the transmission bit string was generated at the transmitter and dividing the reception bit string. The error detector detects errors in the reception bit string based on an agreement or a disagreement between the respective remainders obtained by the first and second shift registers.

In still another aspect of the present invention, in the error detector, the first feedback shift register comprises: a first register unit having stages equal in number to the highest degree of the specified generator polynomial; the first operation unit for performing an operation between an input value to the first register unit and an output value from the final stage and outputting a result of the operation to the first stage; and a second operation unit for performing an operation between the result of the operation performed by the first operation unit and an output value from the stage which is smaller by one ordinal number than the degree of each of the terms of the specified generator polynomial other than the highest-degree and lowest-degree terms. The second feedback shift register comprises: a second register unit having stages equal in number to the highest degree of the specified generator polynomial; a third operation unit for performing an operation between an input value to the second register unit and an output value from the final stage and outputting a result of the operation to the first stage; and a fourth operation unit for performing an operation between the output value from the final stage and an output value from the stage corresponding to the degree of each of the terms of the specified generator polynomial other than the highest-degree and lowest-degree terms and outputting a result of each operation to the subsequent stage.

As a result, the value of the first register unit of the first feedback shift register in each state is changed in the same direction as when the feedback shift register at the transmitter performed shift operations by causing the first feedback shift register to perform shift operations and inputting the reception bit string thereto in the same order in which the transmission bit string was generated at the transmitter. The value of the second register unit of the second feedback shift register in each state is changed in the direction that returns the check bit string generated by the feedback shift register at the transmitter to the initial value, by causing the second feedback shift register to perform shift operations and inputting the reception bit string thereto in reverse order to the transmission bit string was generated at the transmitter. If the reception bit string has no errors, the value of the first register unit and the value of the second register unit coincide with each other when each of the first and second feedback shift registers performs shift operations. Whether errors in the reception bit string is present or not is detected based on an disagreement or agreement between the respective remainders obtained by the first and second feedback shift registers.

In still another aspect of the present invention, the error detector comprises comparing unit for comparing the respective remainders obtained by the first and second feedback shift registers and outputting error data indicative of a dissimilarity as a result of the comparison. The arrangement allows the error detection based on the result of the comparison performed by the comparing unit.

In still another aspect of the present invention, the error detector comprises specified value setting unit for setting a specified value to each of the first and second feedback shift registers. The arrangement allows the setting of a specified value to each of the first and second registers without causing the first and second feedback shift registers to perform shift operations.

In one of the aspects of the present invention, in the semiconductor device, each of the foregoing error detectors can be composed of an error detector formed in the semiconductor device with other communication functional elements without increasing the manufacturing cost. Since the feedback shift register composing the error detector has been constructed by merely reversing the shift direction and the feedback direction of the feedback shift register at the transmitter, if the conventional semiconductor device has a feedback shift register of the same construction as that of the feedback shift register at the transmitter, the semiconductor device comprising a feedback shift register which is opposite in shift direction and in feedback direction can be formed easily by merely changing a mask for the wiring layer of the semiconductor device and changing the wiring of the feedback shift register. In this case, there is no need to change the chip size and pad position of the semiconductor device and any changes do not influence on exterior of the semiconductor device.

In one of the aspects of the present invention, in the error detection method, the inputting of a reception bit string to a division procedure using a specified generator polynomial as a divisor is performed in an order reverse to the order in which the transmission bit string was generated at the transmitter by using the generator polynomial. Errors in the reception bit string are detected based on the obtained remainder, which reduces the processing time required for the error detection.

In another aspect of the present invention, in the error detection method, the remainder from the division procedure is compared with a predetermined expected value, the reception bit string is judged to be erroneous when the result of the comparison indicates a dissimilarity therebetween, so that the processing time required for the error detection is reduced.

In yet another aspect of the present invention, in the error detection method, a buffer unit for receiving the remainder from the division procedure is initialized before the division procedure is executed, which reduces the processing time required for the error detection.

In still another aspect of the present invention, in the error detection method, a buffer unit for receiving the remainder from the division procedure is set to a specified value before the division procedure is executed, which reduces the processing time required for the error detection.

In still another aspect of the present invention, in the error detection method, the first and second division procedures each for dividing a reception bit string by a specified generator polynomial are provided. The inputting of the reception bit string to the first division procedure is performed in the same order in which a transmission bit string is generated by using the generator polynomial at the transmitter. On the other hand, the inputting of the reception bit string to the second division procedure is performed in an order reverse to the order in which the transmission bit string is generated by using the generator polynomial at the transmitter. The respective remainders from the first and second division procedures are compared and the reception bit string is judged to be erroneous when the result of the comparison indicates a dissimilarity therebetween.

In another aspect of the present invention, in the error detection method, each of the first buffer unit for receiving the remainder from the first division procedure and the second buffer unit for receiving the remainder from the second division procedure is set to a specified value before the first and second division procedures are executed, so that the processing time required for the error detection is reduced.

BRIEF DESCRIPTION OF THE DRAWINGS

FIG. 4 is a state diagram showing the operation of the feedback shift register at the receiver in the conventional communication system.

FIG. 12 is a state diagram showing the operation of the feedback shift register at the transmitter shown in FIG. 8;

FIG. 13 is a timing chart showing the operation of the feedback shift register at the transmitter shown in FIG. 8;

FIG. 14 is a state diagram showing the operation of the feedback shift register at the receiver shown in FIG. 9;

FIG. 27 is a state diagram showing the operation of the first feedback shift register shown in FIG. 24;

FIG. 28 is a state diagram showing the operation of the second feedback shift register shown in FIG. 25;

DESCRIPTION OF THE PREFERRED EMBODIMENTS

Figure 1:
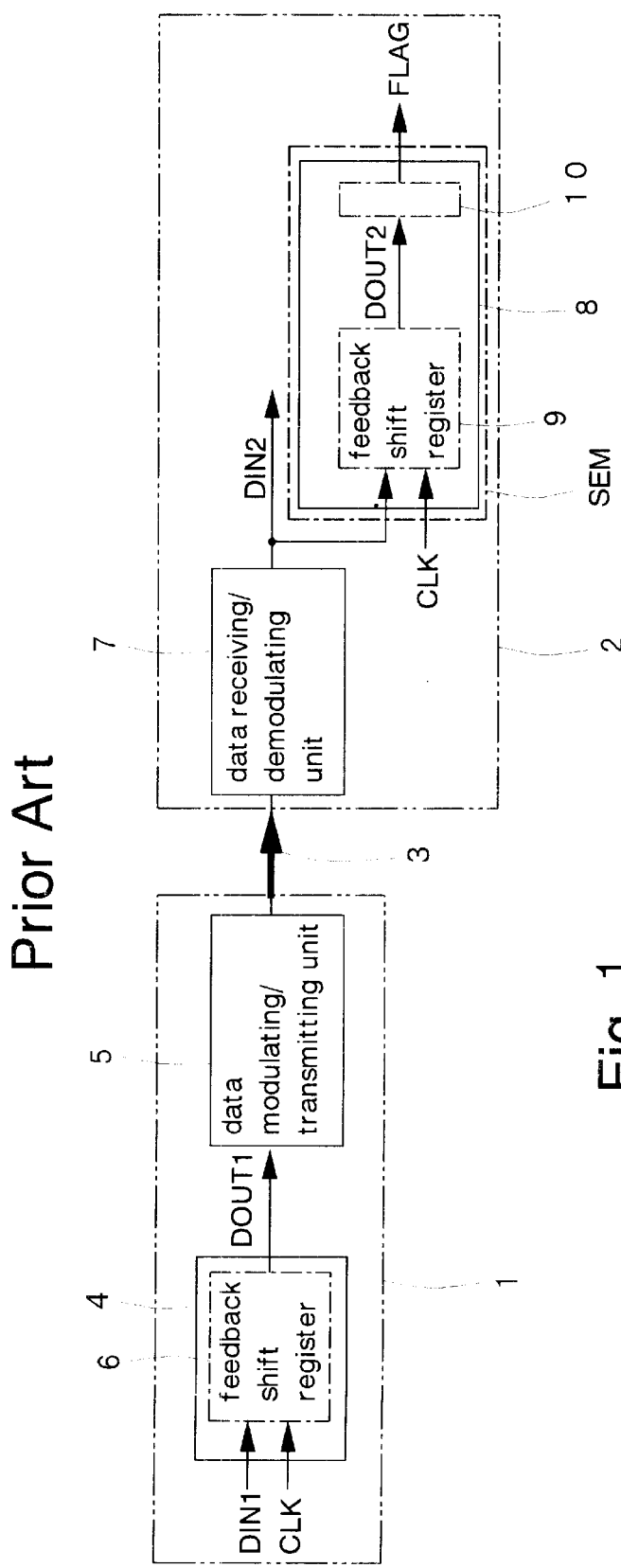
FIG. 1 is a view showing the overall structure of a conventional communication system.

Referring to the drawings, the embodiments of the present invention will be described in detail.

Figure 6:
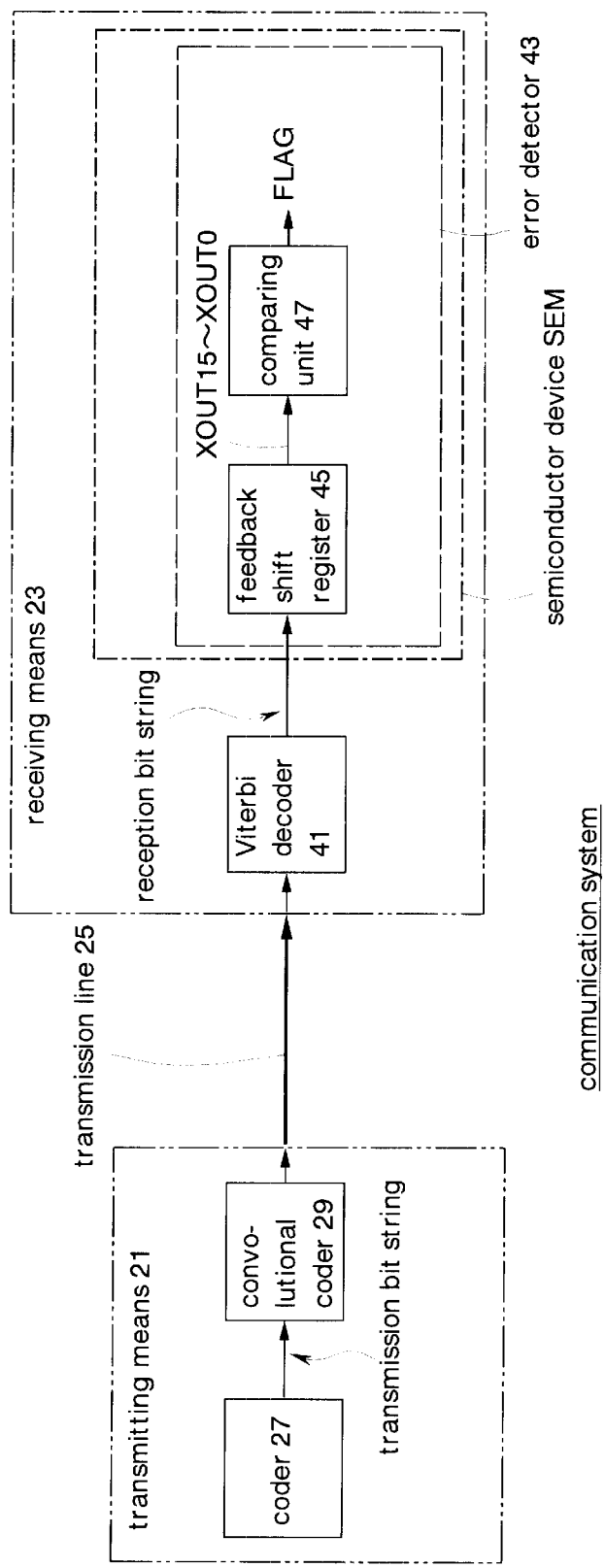
FIG. 6 is a block diagram showing the basic principle of an error detector, a semiconductor device comprising the error detector, and an error detection method according to a first embodiment of the present invention.

FIG. 6 is a block diagram showing the basic principle of an error detector, a semiconductor device comprising the error detector, and an error detection method according to the first embodiment of the present invention. Transmitting means and receiving means corresponding respectively to a transmitter 21 and a receiver 23, which will be described later, are connected to each other via a transmission line corresponding to a radio transmission line 25. The transmitting means, the receiving means, and the transmission line constitute the communication system.

The transmitting means comprises a coder 27 and a convolutional coder 29, which will be described later. The receiving means comprises a decoder corresponding to a Viterbi decoder 41, which will be described later, and an error detector 43.

The error detector 43 is composed of, e.g., a semiconductor device SEM, and comprises a feedback shift register 45 and a comparing unit 47, each of which will be described later.

The transmitting means has the function of generating a transmission bit string by means of the coder 27, changing the generated transmission bit string into a convolutional code by means of the convolutional coder 29, and outputting the convolutional code onto the transmission line.

The receiving means has the function of decoding the received data into a reception bit string by means of the decoder 41 and detecting errors in the reception bit string by means of the error detector 43. The error detector 43 performs the error detection by comparing a remainder obtained by the feedback shift register 45 and a predetermined expected value by using the comparing unit 47. The comparing unit 47 outputs an error detecting signal FLAG when the result of the comparison indicates a dissimilarity therebetween.

Figure 7:
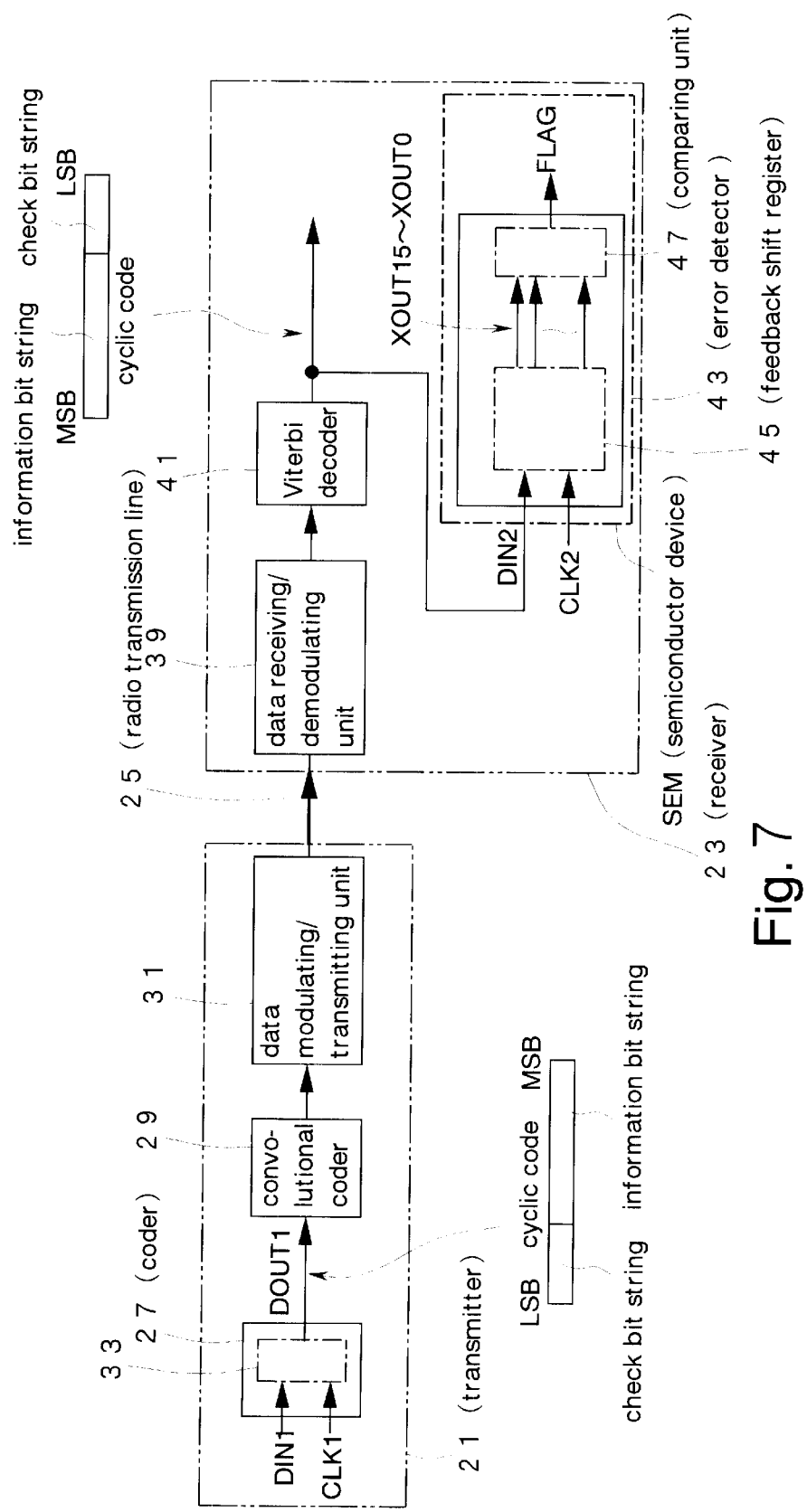
FIG. 7 is a view showing the overall structure of the error detector, the semiconductor detector comprising the error detector, and the error detection method according to the first embodiment.

FIG. 7 shows the error detector, the semiconductor device comprising the detector, and the error detection method according to the first embodiment. The communication system in the drawing is composed of the transmitter 21 and the receiver 23 connected to each other via the radio transmission line 25. The transmitter 21 and the receiver 23 correspond to, e.g., a base station and a mobile terminal for mobile telecommunication such as a mobile phone, respectively.

The transmitter 21 has the coder 27 for converting data to be transmitted to a cyclic code, the convolutional coder 29 for converting the coded data to a convolutional code, and a data modulating/transmitting unit 31 for modulating the convolutional code and outputting the modulated convolutional code as the transmission bit string onto the radio transmission line 25. The coder 27, the convolutional coder 29, and the data modulating/transmitting unit 31 are connected in cascade.

Figure 2:
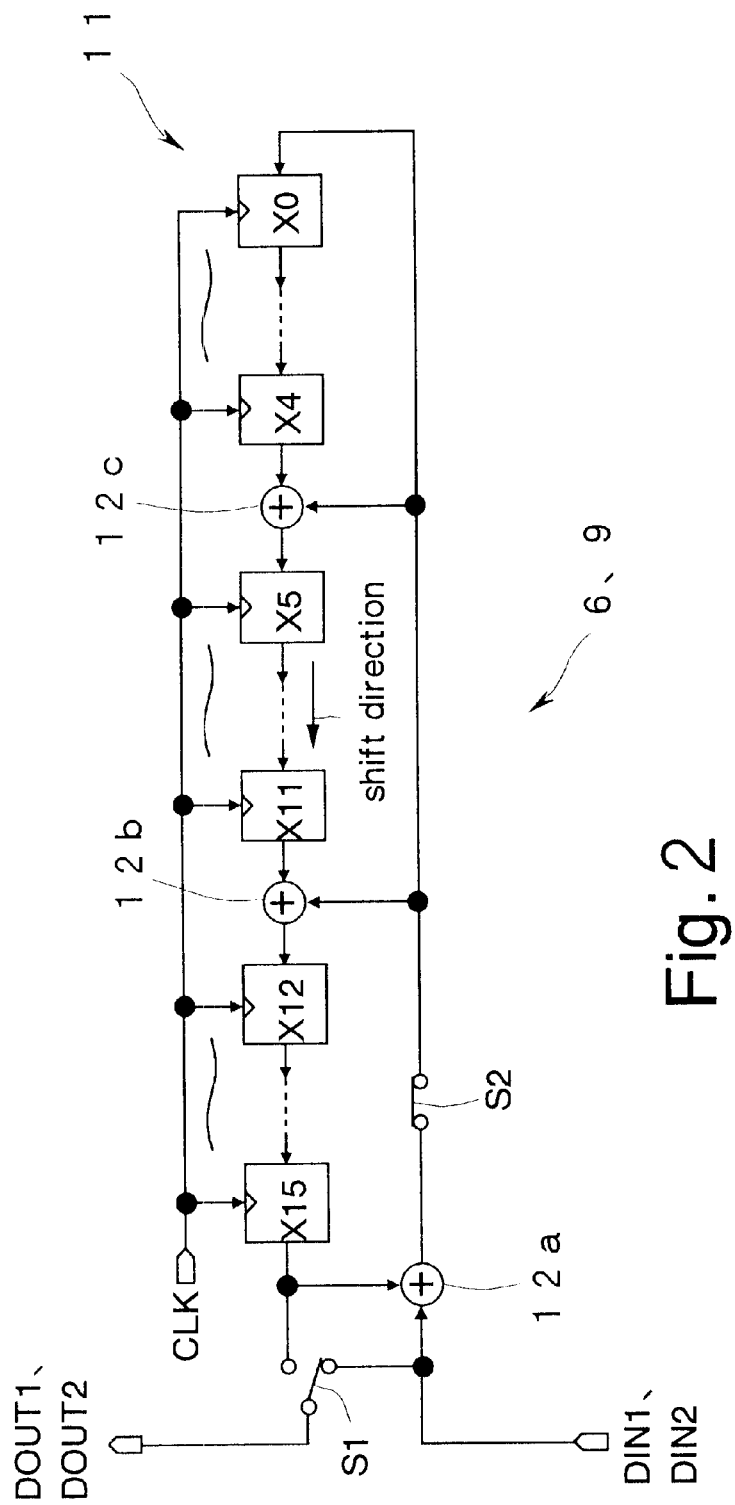
FIG. 2 is a circuit diagram showing a feedback shift register provided in the conventional communication system.
Figure 3:
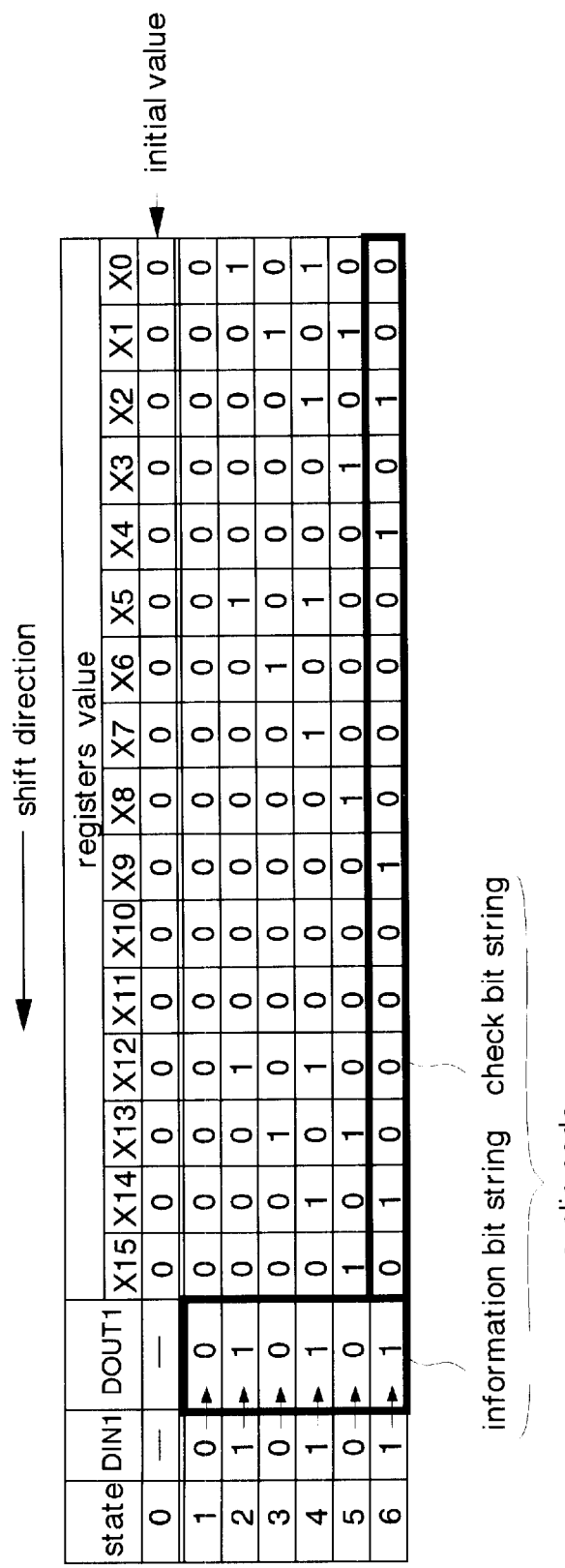
FIG. 3 is a state diagram showing the operation of the feedback shift register at the transmitter in the conventional communication system.
Figure 5:
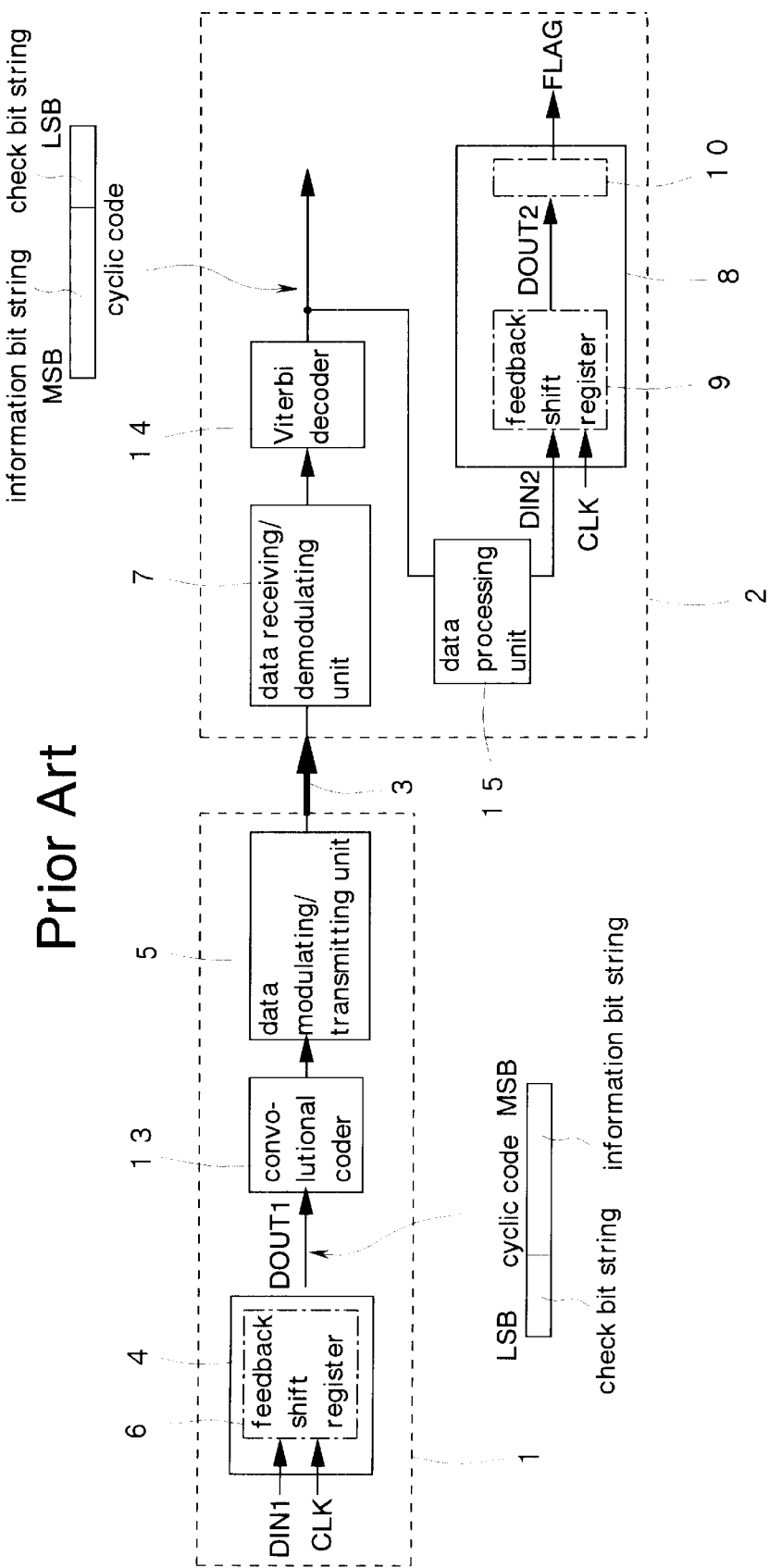
FIG. 5 is a view showing the overall structure of another conventional communication system.
Figure 8:
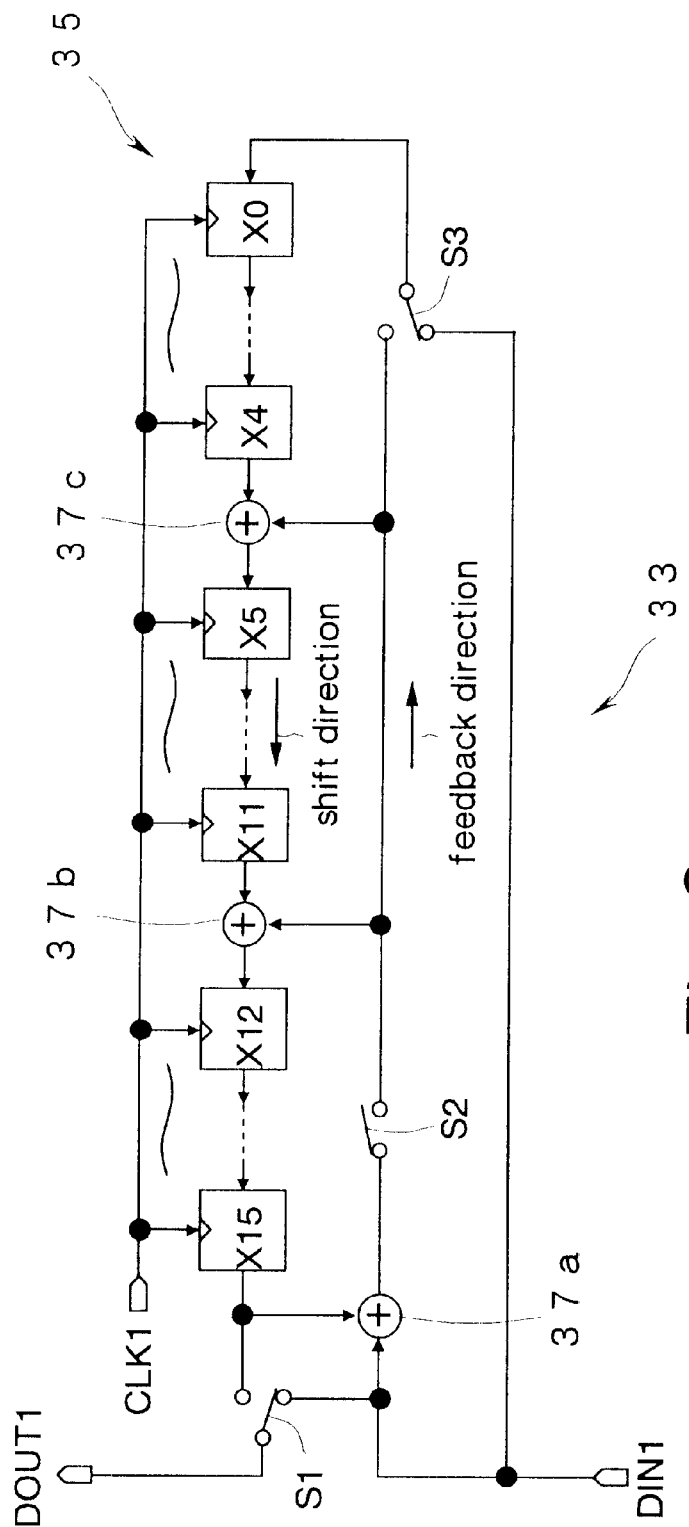
FIG. 8 is a circuit diagram showing a feedback shift register at a transmitter of FIG. 7.

The coder 27 is composed of a feedback shift register 33 for generating a cyclic code, which is a type of linear code. As shown in FIG. 8, a feedback shift register 33 has the same dividing function as the feedback shift register 6 conforming to the sixteenth-degree generator polynomial $X^{16}+X^{12}+X^5+1$ according to the conventional embodiment shown in FIG. 2. The feedback shift register 33 is constituted of a register unit 35 consisting of sixteen flip-flop circuits X15 to X0 (hereinafter referred to as F/F circuits X15 to X0) connected in cascade, three EOR (Exclusive OR) circuits 37a, 37b, and 37c, and switches S1, S2, and S3.

In the register unit 35, a shift direction has been set such that data is shifted from the F/F circuit X0 to the F/F circuit X15. A clock signal CLK1 is connected to the clock terminal of each of the F/F circuits X15 to X0 such that shift operations are performed in synchronization.

The EOR circuit 37a receives an output of the F/F circuit X15 and an input signal DIN1 and outputs the result of the operation to the F/F circuit X0. The EOR circuit 37b receives the output of the EOR circuit 37a and an output of the F/F circuit X11 and outputs the result of the operation to the F/F circuit X12. The EOR circuit 37c receives the output of the EOR circuit 37a and an output of the F/F circuit X4 and outputs the result of the operation to the F/F circuit X5.

The switch S1 is for selectively connecting an output of the F/F circuit X15 or the input signal DIN1 to an output signal DOUT1 of the feedback shift register 33. The switch 2 is for feeding back the output of the EOR circuit 37a to the EOR circuits 37b and 37c and to the F/F circuit X0. The switch S3 is for connecting the input signal DIN1 directly to the F/F circuit X0 in order to set the register unit 35 to a specified value.

As shown in FIG. 7, the receiver 23 has a data receiving/demodulating unit 39 for receiving data transmitted via the radio transmission line 25 as the reception bit string and demodulating the reception bit string to the original convolutional code, the Viterbi decoder 41 for decoding the demodulated convolutional code to the cyclic code and performing the error detection simultaneously, and the error detector 43 for detecting errors in the decoded cyclic code. The data receiving/demodulating unit 39, the Viterbi decoder 41, and the error detector 43 are connected in cascade.

In the present embodiment, the error detector 43 has been formed in the semiconductor device SEM such as a channel CODEC LSI (Coder Decoder LSI).

The error detector 43 has the feedback shift register 45 for generating a cyclic code, which is a type of linear code, and the comparing unit 47 for comparing the outputs XOUT15-XOUT0 of the feedback shift register 45 and a specified expected value.

Figure 9:
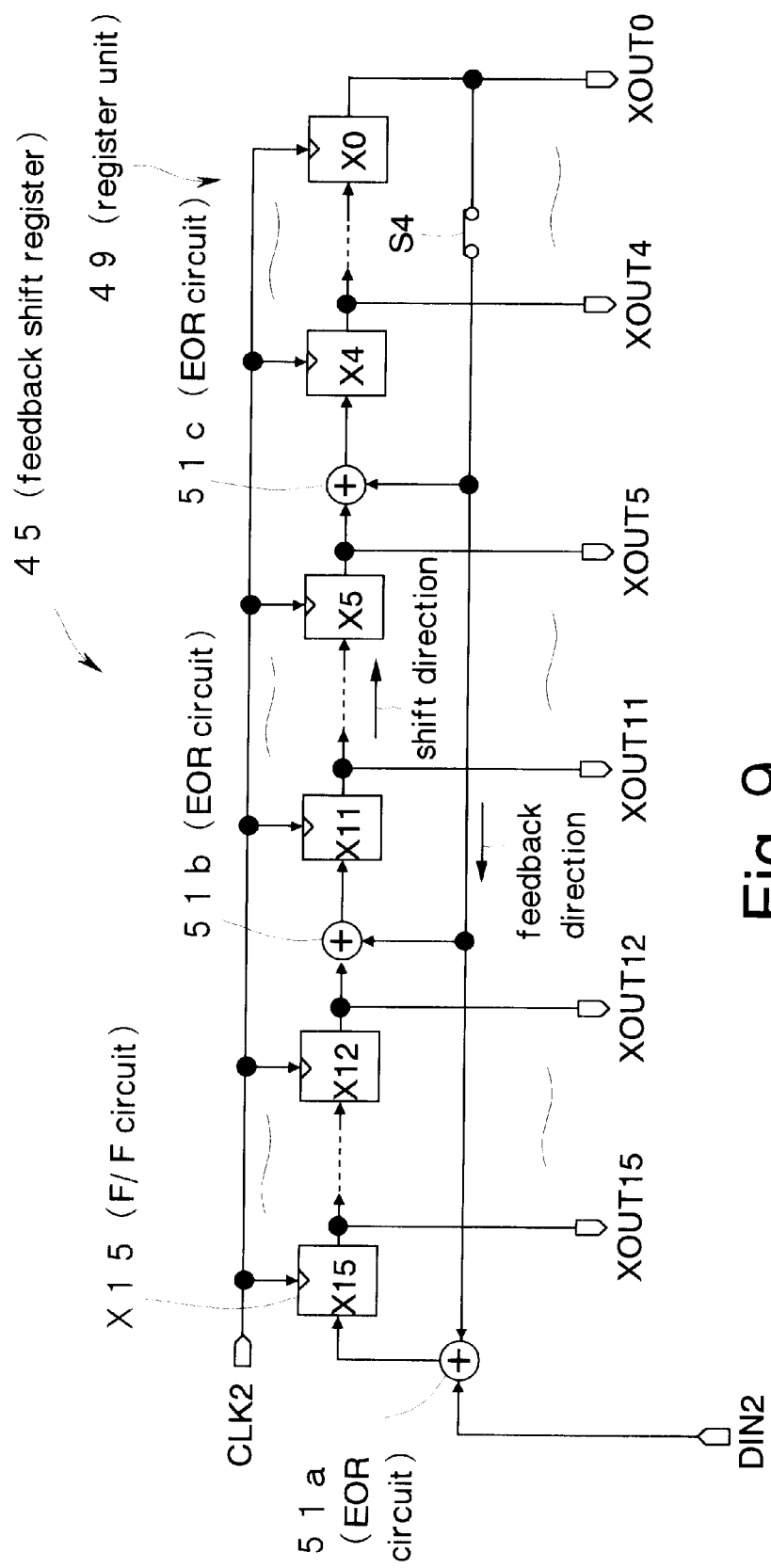
FIG. 9 is a circuit diagram showing a feedback shift register at a receiver of FIG. 7.

As shown in FIG. 9, the feedback shift register 45 has a register unit 49 consisting of sixteen flip-flop circuits X15 to X0 (hereinafter referred to as F/F circuits X15 to X0) connected in cascade, three EOR circuits 51a, 51b, and 51c each for performing a specified operation, and a switch S4. In the register unit 49, a shift direction has been set such that data is shifted from the F/F circuit X15 of the first stage to the F/F circuit X0. Thus, according to the present embodiment, the F/F circuit X15 is in the first stage and the F/F circuit X0 is in the final stage.

A clock signal CLK2 is connected to the clock terminal of each of the F/F circuits X15 to X0 such that shift operations are performed in synchronization. The F/F circuits X15 to X0 output respective values held thereby as output signals XOUT15 to XOUT0 to the outside.

The EOR circuit 51a receives an output signal XOUT0 of the F/F circuit X0 and an input signal DIN2 and outputs the result of the operation to the F/F circuit X15. The EOR circuit 51b receives the output signal XOUT0 of the F/F circuit X0 and an output signal XOUT12 of the F/F circuit X12 and outputs the result of the operation to the F/F circuit X11 in the subsequent stage. The EOR circuit 51c receives the output signal XOUT0 of the F/F circuit X0 and an output signal XOUT5 of the F/F circuit X5 and outputs the result of the operation of the F/F circuit X4 in the subsequent stage.

In short, the shift direction and the feedback direction in the dividing circuit of the feedback shift register 45 are opposite to the shift direction and the feedback direction in the feedback shift register 33 at the transmitter 21 conforming to the generator polynomial $X^{16}+X^{12}+X^{5}+1$, which is shown in FIG. 7.

The switch S4 is for feeding back the output signal XOUT0 of the F/F circuit X0 to the EOR circuits 51b and 51c and to the EOR circuit 51a. By closing the switch S4, the output signal XOUT0 is fed back to each of the EOR circuits 51a, 51b, and 51c. By opening the switch S4, the output signal XOUT0 is inhibited from being fed back to each of the EOR circuits 51a, 51b, and 51c.

Figure 10:
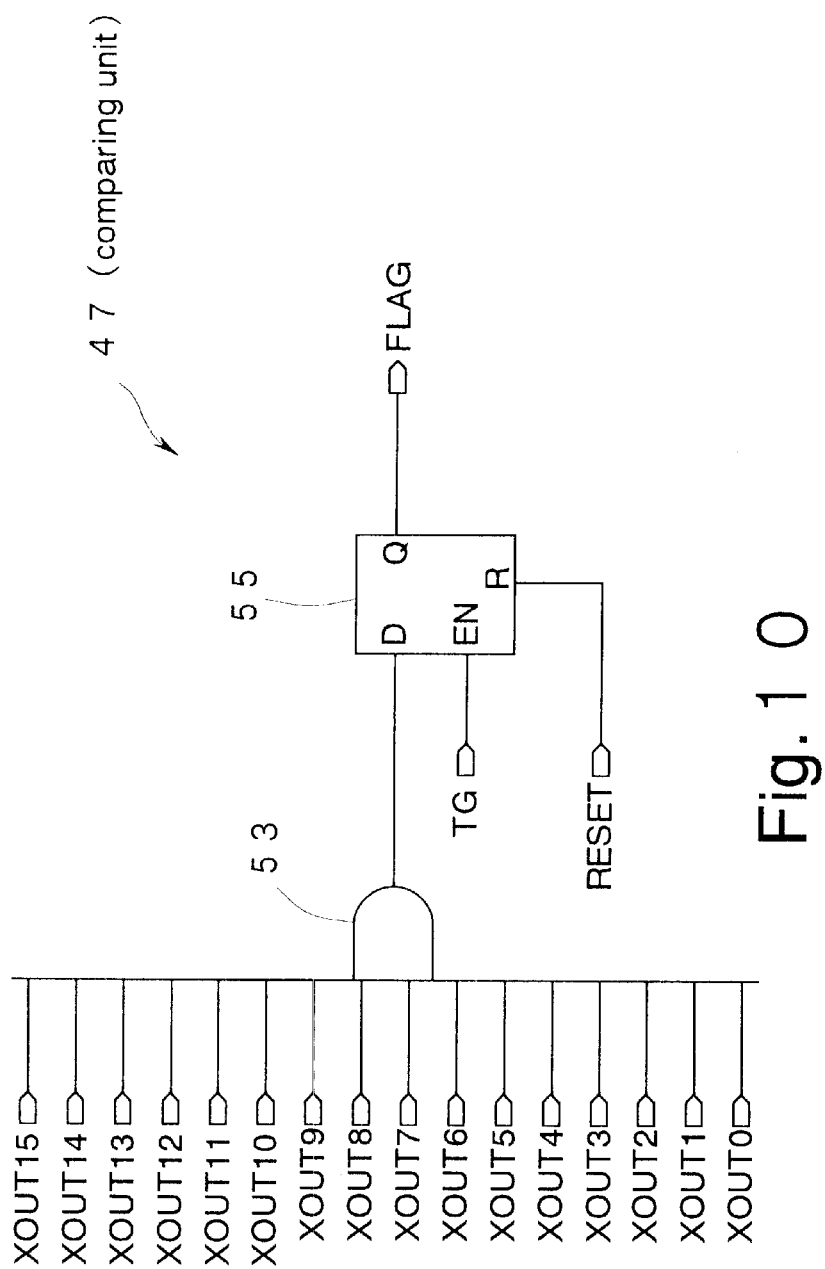
FIG. 10 is a circuit diagram showing a comparing unit of FIG. 7.

As shown in FIG. 10, the comparing unit 47 of FIG. 7 is composed of a 16-input AND circuit 53 and a flip-flop circuit 5 having a reset terminal R and an enable terminal EN.

The output signals XOUT15 to XOUT0 of the feedback shift register 45 are connected to the respective input terminals of the AND circuit 53. The AND circuit 53 has an output connected to the input terminal D of the flip-flop circuit 55.

A trigger signal TG is connected to the enable terminal EN of the flip-flop circuit 55, while a reset signal RESET is connected to the reset terminal R of the flip-flop circuit 55. The error detecting signal FLAG for outputting error data is outputted from the output terminal Q of the flip-flop circuit 55. The output terminal Q is for outputting a value having the same logic as the value inputted to the input terminal D.

In the communication system shown in FIG. 7, errors in data transmitted from the transmitter 21 are detected as follows. As an example, the following description will be given of the case where a 6-bit information bit string "01 0101" is transmitted.

Figure 11:
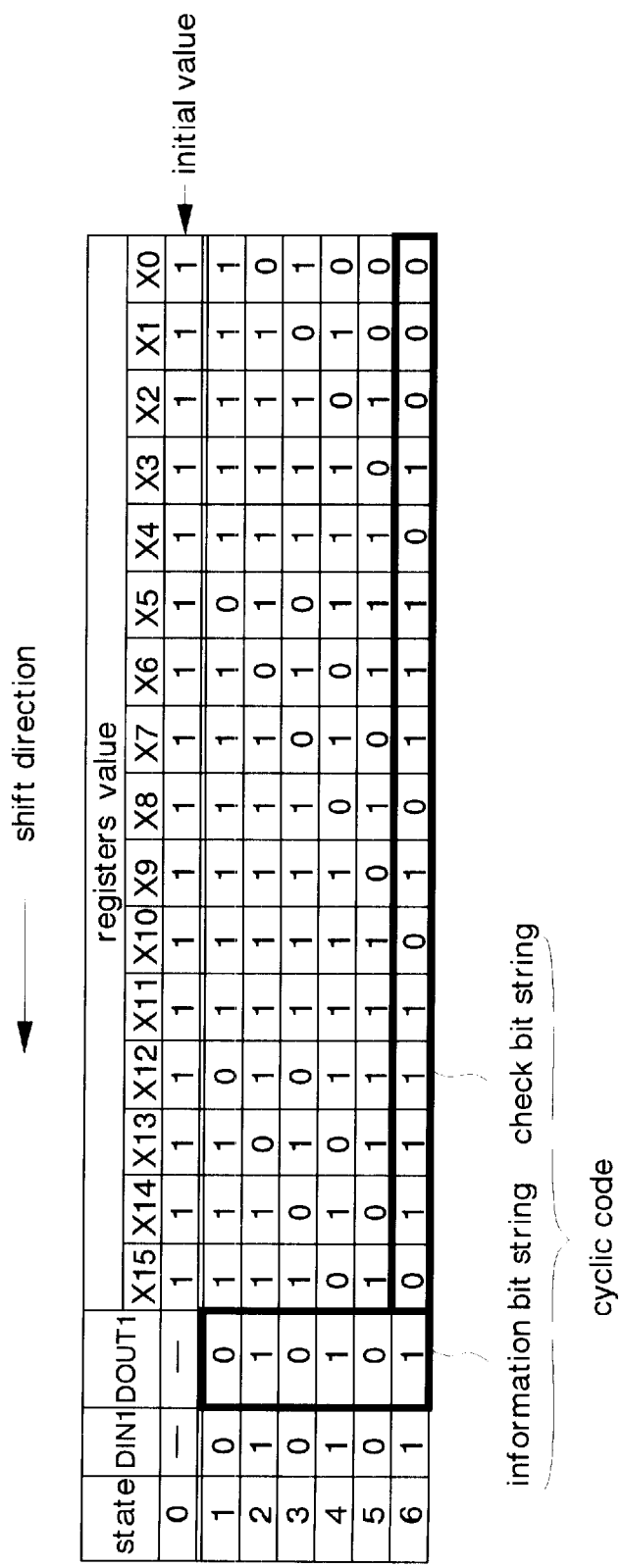
FIG. 11 is a state diagram showing the operation of the feedback shift register at the transmitter shown in FIG. 8.
Figure 1:
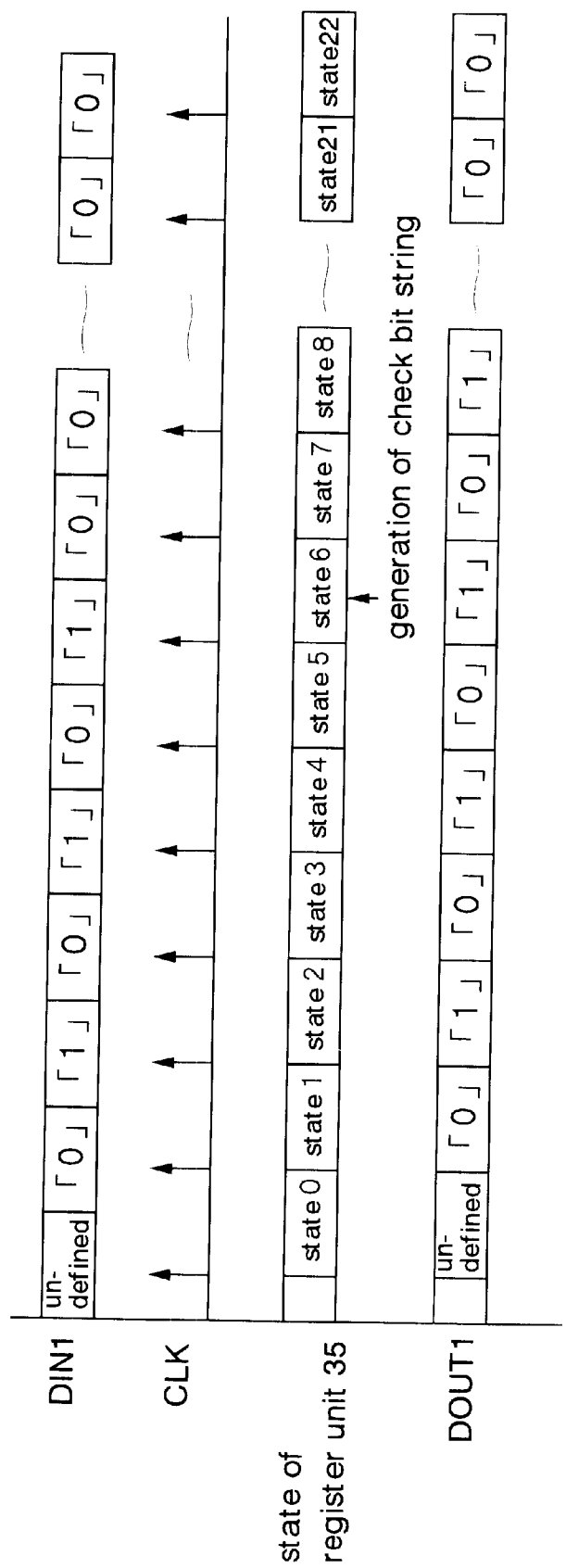

FIGS. 11 and 12 show the respective states of the F/F circuits X15 to X0 when the feedback shift register 33 of the coder 27 at the transmitter 21 is operated. Upon each receipt of the clock signal CLK1, the feedback shift register 33 shifts the values held by the F/F circuits X15 to X0 to the left in the drawing, so that "STATE" is incremented by 1 upon each receipt of the clock signal CLK1. That is, the individual F/F circuits X15 to X0 undergo transitions from "STATE 0" to "STATE 6" and from "STATE 6" to "STATE 22" when viewed in the columnar direction.

First, the transmitter 21 sets each of the F/F circuits X15 to X0 to "1". The setting is conducted by causing the feedback shift register 33 to perform sixteen shift operations with a "1" inputted to the input signal DIN1. In the operations, the switch S2 of FIG. 8 is open, while the switch S3 is switched to connect the input signal DIN1 to the flip-flop X0.

Thereafter, the transmitter 21 sequentially inputs the information bit string "01 0101" from the input signal DIN1 to the feedback shift register 33 to generate a check bit string. In "STATE 1" through "STATE 6", the switch S1 is switched so as to connect the input signal DIN1 and the output signal DOUT1, while the switch S2 is closed. The switch S3 is switched to connect the output of the EOR circuit 37a to the F/F circuit X0. Accordingly, the information bit string "01 0101" received from the input signal DIN1 is inputted to the feedback shift register 33, while it is outputted simultaneously to the output signal DOUT1.

The values "0111 1010 1110 1000" held by the F/F circuits X15 to X0 when the feedback shift register has operated to reach "STATE 6" form the check bit string so that the cyclic code "01 0101 0111 1010 1110 1000" enclosed in the bold rectangle of FIG. 11 is generated.

As shown in FIG. 12, the retrieval of the check bit string is performed by operating the feedback shift register 33 and sequentially outputting the values held by the F/F circuits X15 to X0 in "STATE 6" to the output signal Dou1. At this time, the switch S1 of FIG. 8 is switched to connect the output of the F/F circuit X15 to the output signal DOUT1, while the switch S2 is open. The switch S3 may be switched to either side. By opening the switch S2, a "0" is inputted to each of the F/F circuit X0 and EOR circuits 37b and 37c.

FIG. 13 shows an operation timing for the feedback shift register 33 in "STATE 0" through "STATE 22" shown in FIGS. 11 and 12. In "STATE 1" through "STATE 6", the information bit string inputted to the input signal DIN1 is outputted bit by bit to the output signal DOUT1 in synchronization with the clock signal CLK. In "STATE 6" through "STATE 22", the check bit string generated in the feedback shift register 33 is outputted bit by bit to the output signal DOUT1 in synchronization with the clock signal CLK.

Therefore, the feedback shift register 33 sequentially outputs the cyclic code (information bit string+check bit string) via the output signal DOUT1 from the most significant bit (hereinafter referred to as MSB) side. The cyclic code outputted via the output signal DOUT1 is sequentially inputted to the convolutional coder 29 shown in FIG. 7.

The convolutional coder 29 generates a convolutional code from the cyclic code and outputs the generated convolutional code to the data modulating/transmitting unit 31. The data modulating/transmitting unit 31 modulates the convolutional code and outputs the modulated convolutional code onto the radio transmission line 25.

The data receiving/demodulating unit 39 in the receiver 23 receives the modulated convolutional code from the radio transmission line 25, sequentially demodulates it to the original convolutional code, and outputs the demodulated convolutional code to the Viterbi decoder 41.

The Viterbi decoder 41 decodes the received convolutional code to the original cyclic code, while correcting a burst error or the like that has occurred on the radio transmission line 25 to recover the original correct bit string. In the Viterbi decoder 41, the cyclic code is decoded from the least significant bit (hereinafter referred to as LSB) side.

The cyclic code decoded by the Viterbi decoder 41 is inputted sequentially from the LSB side to the input signal DIN2 of the error detector 43.

FIG. 14 shows the respective states of the F/F circuits X15 to X0 when the feedback shift register 45 of the error detector 43 is operated. It is to be noted that FIG. 14 shows the operation when the decoded cyclic code has no errors.

First, the error detector 43 resets each of the F/F circuits X15 to X0 of the feedback shift register 45 to "0" to place the feedback shift register 45 in "STATE 0". The resetting is conducted by causing the feedback shift register 45 to perform sixteen shift operations with a "0" inputted to the input signal DIN2. In the operations, the switch S4 of FIG. 9 is open. By opening the switch S4, a "0" is inputted to each of the EOR circuits 51a, 51b, and 51c.

The cyclic code sequentially transmitted from the Viterbi decoder 41 is inputted bit by bit to the feedback shift register 45 via the input signal DIN2. When the feedback shift register 45 has operated to reach "STATE 16", the feedback shift register 45 is loaded with the check bit string generated by the feedback shift register 33 at the transmitter 21, as indicated by the bold rectangle shown in the drawing.

The feedback shift register 45 further operates to cause transitions from "STATE 17" to "STATE 22", whereby the information bit string is inputted from the LSB side into the feedback shift register 45 via the input signal DIN2. When the feedback shift register 33 has operated to reach "STATE 22", the respective values held by the F/F circuits X15 to X0 become "1111 1111 1111 1111", which is the initial value of the feedback shift register 33 at the transmitter 21.

That is, if the received cyclic code has no errors, the respective values held by the F/F circuits X15 to X0 of the feedback shift register 45 in "STATE 0" through "STATE 22" become equal to the respective values held by the F/F circuits X15 to X0 of the feedback shift register 33 in "STATE 22" through "STATE 0".

In "STATE 1" through "STATE 22", the switch S4 is closed.

Figure 15:
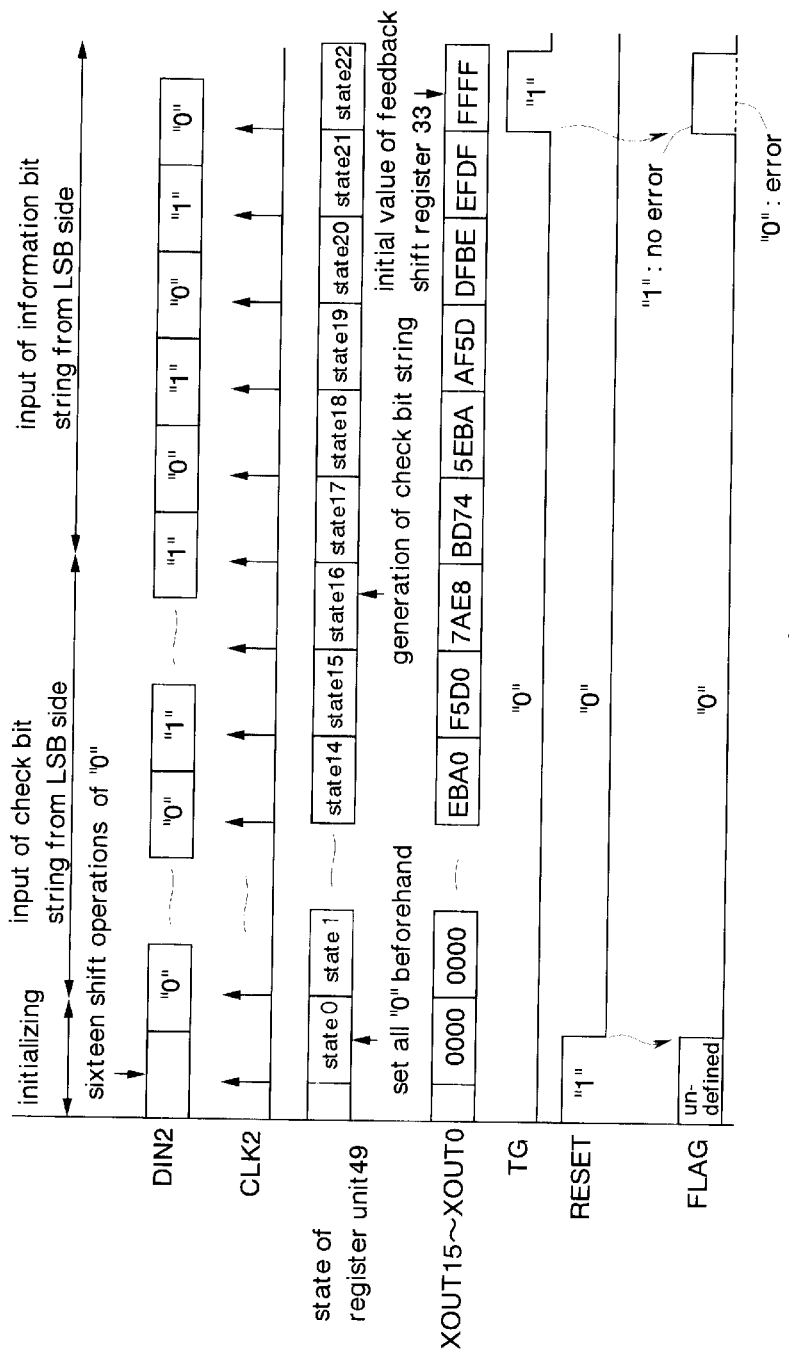
FIG. 15 is a timing chart showing the operation of the feedback shift register at the receiver shown in FIG. 9.

FIG. 15 shows operation timing for the feedback shift register 45 and the comparing unit 47 in "STATE 0" through "STATE 22" shown in FIG. 14.

The error detector 43 changes the reset signal RESET from "1" to "0" in "STATE 0" to reset the flip-flop circuit 55 and set the error detecting signal FLAG to "0". In "STATE 1" through "STATE 16", the values inputted to the input signal DIN2 are outputted to the output signals XOUT15 to XOUT0 in synchronization with the clock signal CLK2. In "STATE 17" through "STATE 22", the result (remainder) of the operation performed in the feedback shift register 33 in accordance with the values inputted to the input signal DIN2 is outputted to the output signals XOUT15 to XOUT0 in synchronization with the clock signal CLK2. In FIG. 15, the values of the output signals XOUT15 to XOUT0 are represented in hexadecimal notation.

In "STATE 22", the error detector 43 (see FIG. 7) changes the trigger signal TG from "0" to "1". The flip-flop circuit 55 of FIG. 10 receives an output of the AND circuit 53 at the input terminal D in synchronization with the leading edge of the trigger signal TG and outputs the received value as the error detecting signal FLAG. Since the values of each of the output signals XOUT15 to XOUT0 is "1", the AND curcuit 55 "1" to the flip-flop circuit 55. The flip-flop circuit 55 receives the output of the AND circuit 53 and outputs "1" to the error detecting signal FLAG.

The error detector 43 detects the value "1" of the error detecting signal FLAG and judges the received data as having no errors. If it detects the value "0" of the error detecting signal FLAG, on the other hand, the error detector 43 judges the received data to be erroneous. The receiver 23 receives the judgment and gives a retransmission instruction to the transmitter 21.

In the error detector thus constructed, the shift direction and feedback direction in the feedback shift register 45 at the receiver 23 are opposite to the shift direction and feedback direction in the feedback shift register 33 at the transmitter 21 conforming to the generator polynomial $X^{16}+X^{12}+X^5+1$. Accordingly, the value of the register unit 49 of the feedback shift register 45 in each state can be changed in the direction that returns the check bit string of the cyclic code generated by the feedback shift register 33 at the transmitter 21 to the initial value, by causing the feedback shift register 45 to perform shift operations and inputting the cyclic code in reverse order to one which it was generated at the transmitter 21. Hence, if the value of the register unit 49 when the feedback shift register has reached "STATE 22" as a result of the shift operations does not coincide with the initial value of the feedback shift register 33 at the transmitter 21, the reception bit string can be judged to be erroneous.

As a result, the cyclic code can be inputted to the error detector 43 in reverse order to one which was generated at the transmitter 21 if the Viterbi decoder 41 is provided at the receiver 23, so that the error detection process can be performed efficiently without increasing the processing time required for the error detection.

Moreover, since the comparing unit 47 compares the values of the register unit 49 of the feedback shift register 45 in "STATE 22" and the initial values of the feedback shift register 33, all "1", and outputs the error detecting signal FLAG when the result of the comparison indicates a dissimilarity therebetween, the receiver 23 can judge the presence or absence of errors by detecting the value of the error detecting signal FLAG.

Furthermore, since the error detector 43 has been formed in the semiconductor device SEM thus constructed such as a channel CODEC LSI, the error detector 43 can be formed simultaneously with the formation of the other communication functional units without increasing the manufacturing cost.

It is to be noted that the feedback shift register 45 has been constructed by merely reversing the shift direction and feedback direction in the feedback shift register 33 at the transmitter 21. Therefore, if the semiconductor device SEM used conventionally has the feedback shift register 33 of the same construction as that of the feedback shift register at the transmitter 21, the semiconductor device SEM comprising the feedback shift register 45 which is opposite in shift direction and in feedback direction can be formed easily by merely changing the wiring configuration of the feedback shift register 33 by replacing a mask for the wiring layer of the semiconductor device SEM. In this case, there is no need to change the chip size and pad position of the semiconductor device SEM, which means making any changes to influence the exterior of the semiconductor device SEM can be avoided.

In the communication system thus constructed, the transmission bit string generated by the coder 27 at the transmitter 21 is received as the reception bit string at the receiver, which is inputted to the error detector in reverse order to the order the transmission bit string was generated by the coder 27, whereby errors in the reception bit string are detected.

Moreover, since the convolutional coder 29 for converting the transmission bit string to the convolutional code is provided at the transmitter 21 and the Viterbi decoder 41 for decoding the received convolutional code is provided at the receiver 23, the error detection can be performed by sequentially inputting, without any alterations, the bit string decoded by the Viterbi decoder 41 in reverse order to the transmission bit string was generated.

As a result, a conventional converting circuit for restoring the bit string decoded in the reverse order by the Viterbi decoder 41 to the order in which it was coded and the process by the converting circuit can be omitted, thereby achieving a reduced circuit scale at the receiver 23 and a reduced processing time for the error detection. As a result, data transmission can be performed without the lowering of transmission efficiency.

Figure 16:
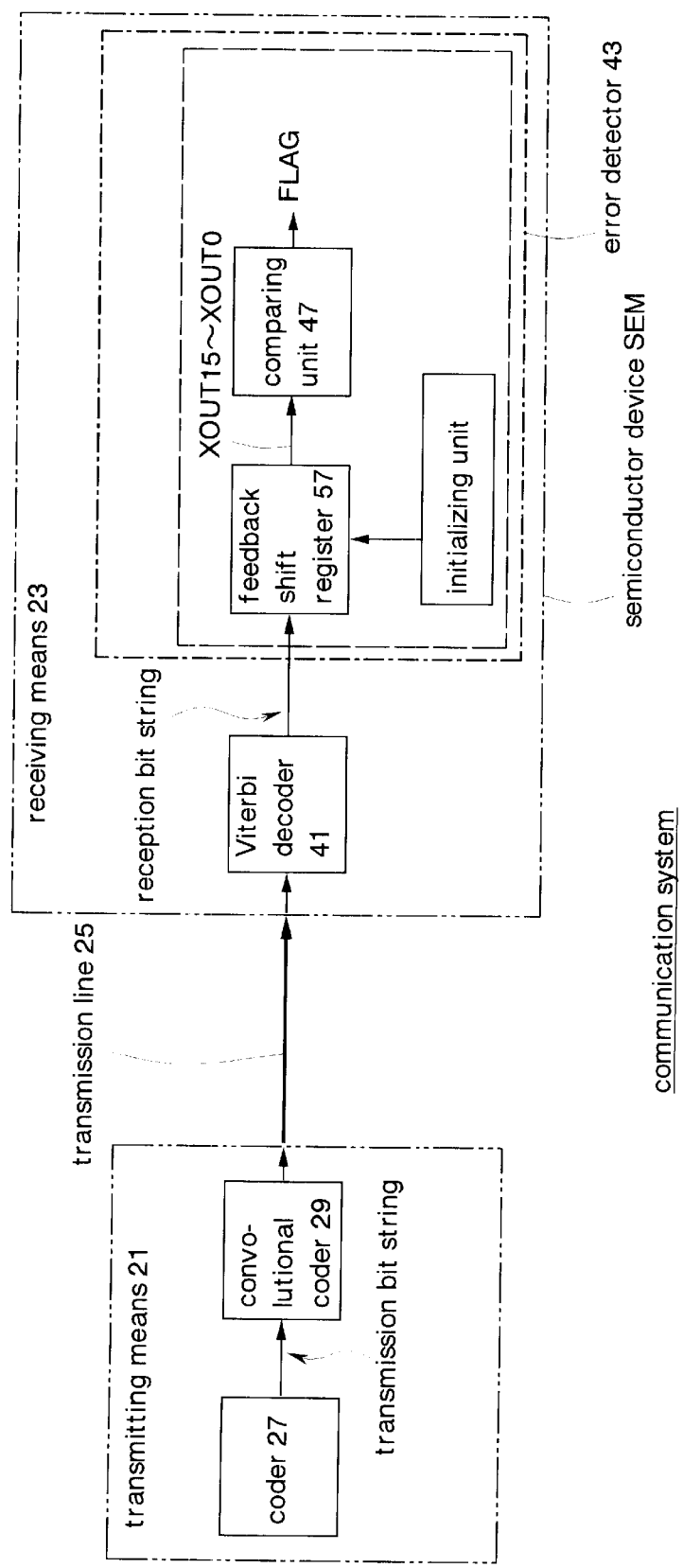
FIG. 16 is a block diagram showing the basic principle of an error detector according to a second embodiment of the present invention.

FIG. 16 is a block diagram showing the basic principle of an error detector according to a second embodiment of the present invention. In the present embodiment, the error detector 43 comprises an initializing unit for initializing a feedback shift register 57. As for the other components, they are the same as in the first embodiment.

Figure 17:
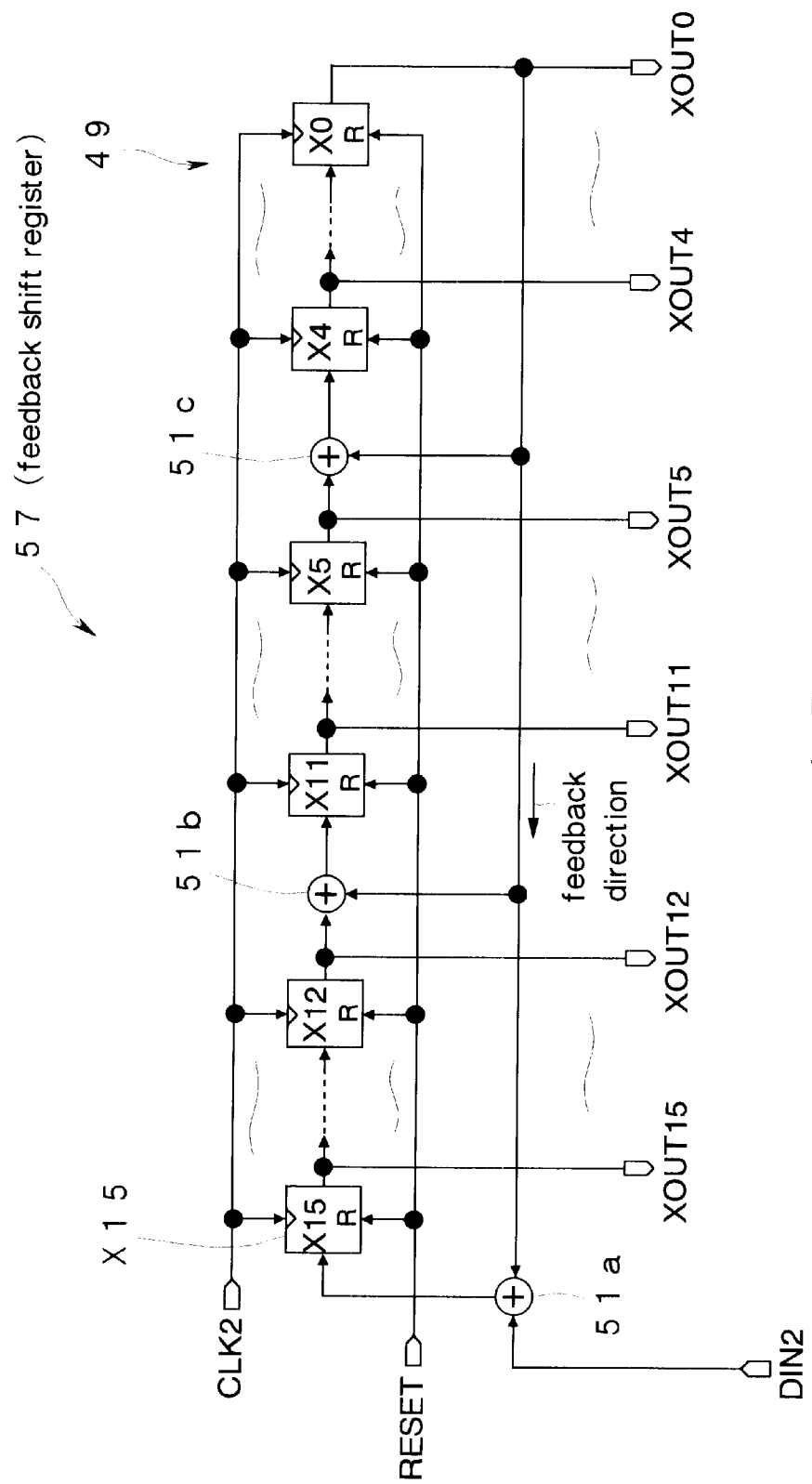
FIG. 17 is a circuit diagram showing the error detector according to the second embodiment.

FIG. 17 depicts in detail the feedback shift register 57 of the error detector at the receiver 23 according to the second embodiment. The feedback shift register 57 is a circuit used in place of the feedback shift register 45 according to the first embodiment. As for the components other than the feedback shift register 57, they are the same as in the first embodiment.

In the present embodiment, the F/F circuits X15 to X0 of the feedback shift register 57 have respective reset terminals R. A reset signal RESET from the initializing unit is connected to each of the reset terminals R. The reset signal RESET is identical to the signal connected to the reset terminal R of the flip-flop circuit 55 of the comparing unit 47 in FIG. 10.

In the present embodiment, the switch S4 of the feedback shift register 45 used in the first embodiment is not provided. In other words, the output signal XOUT0 of the F/F circuit X0, the EOR circuits 51b and 51c, and the EOR circuit 51a are constantly kept in the state where a feedback operation is enabled.

Figure 18:
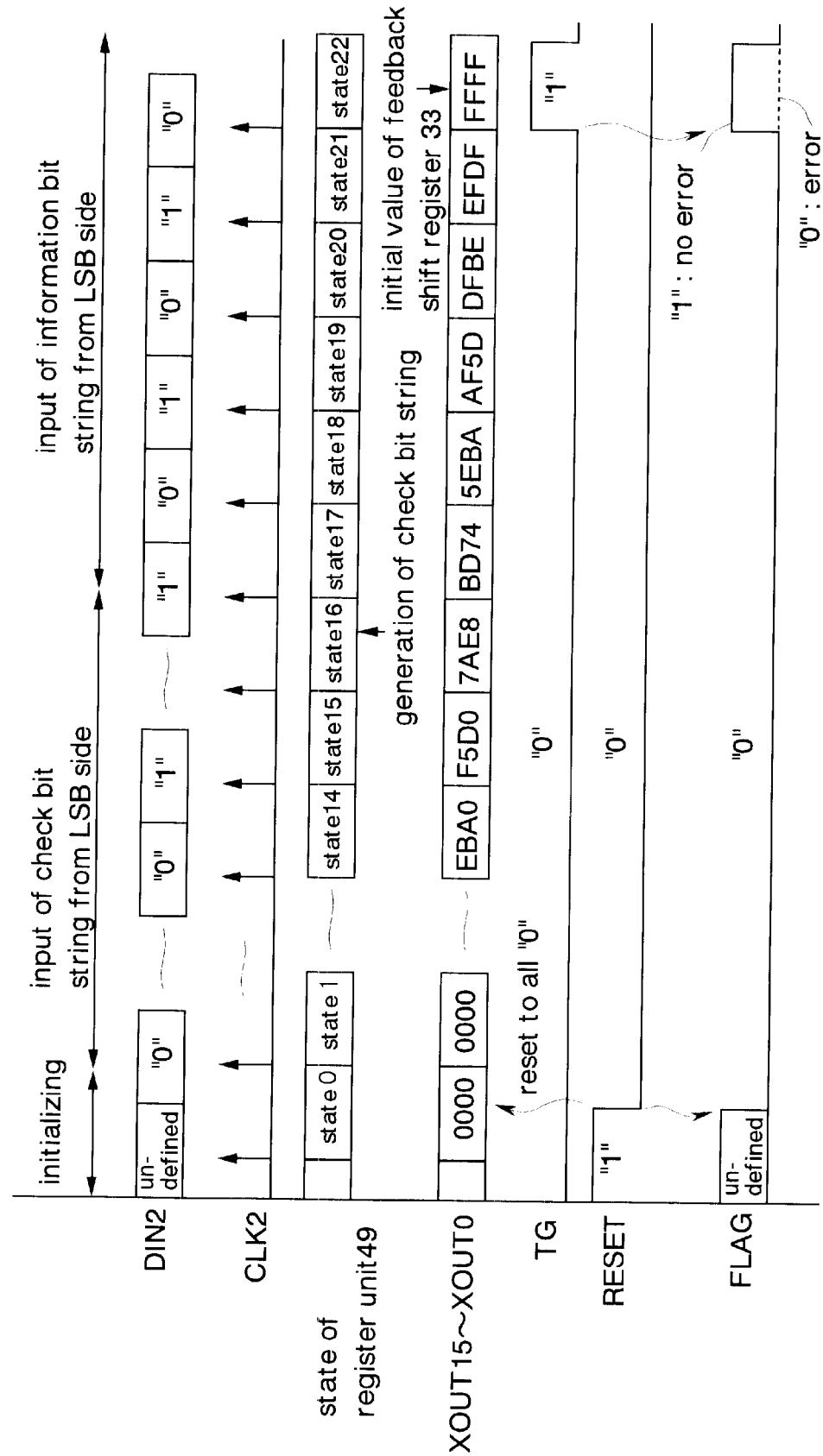
FIG. 18 is a timing chart showing the operation of the feedback shift register at the receiver shown in FIG. 17.

FIG. 18 shows operation timing for the feedback shift register 57 and the comparing unit 47 in "STATE 0" through "STATE 22".

In "STATE 0", the error detector 43 changes the reset signal RESET from "1" to "0" and resets the flip-flop circuit 55 to set the error detecting signal FLAG to "0", while simultaneously resetting each of the F/F circuits X15 to X0 of the feedback shift register 57 to "0". In short, the present embodiment sets the value of each of the F/F circuits X15 to X0 to "0" without causing the feedback shift register 57 to perform shift operations.

In "STATE 1" to "STATE 22", the operation timing for the feedback shift register 57 and the comparing unit 47 are the same as in the first embodiment.

The present embodiment can also achieve the same effects as achieved by the first embodiment described above.

Since the present embodiment has provided the F/F circuits X15 to X0 of the feedback shift register 57 with the respective reset terminals R, the value of each of the F/F circuits X15 to X0 can be set to "0" without causing the feedback shift register 57 to perform shift operations. This achieves reduction in processing time in the error detector 43.

Figure 19:
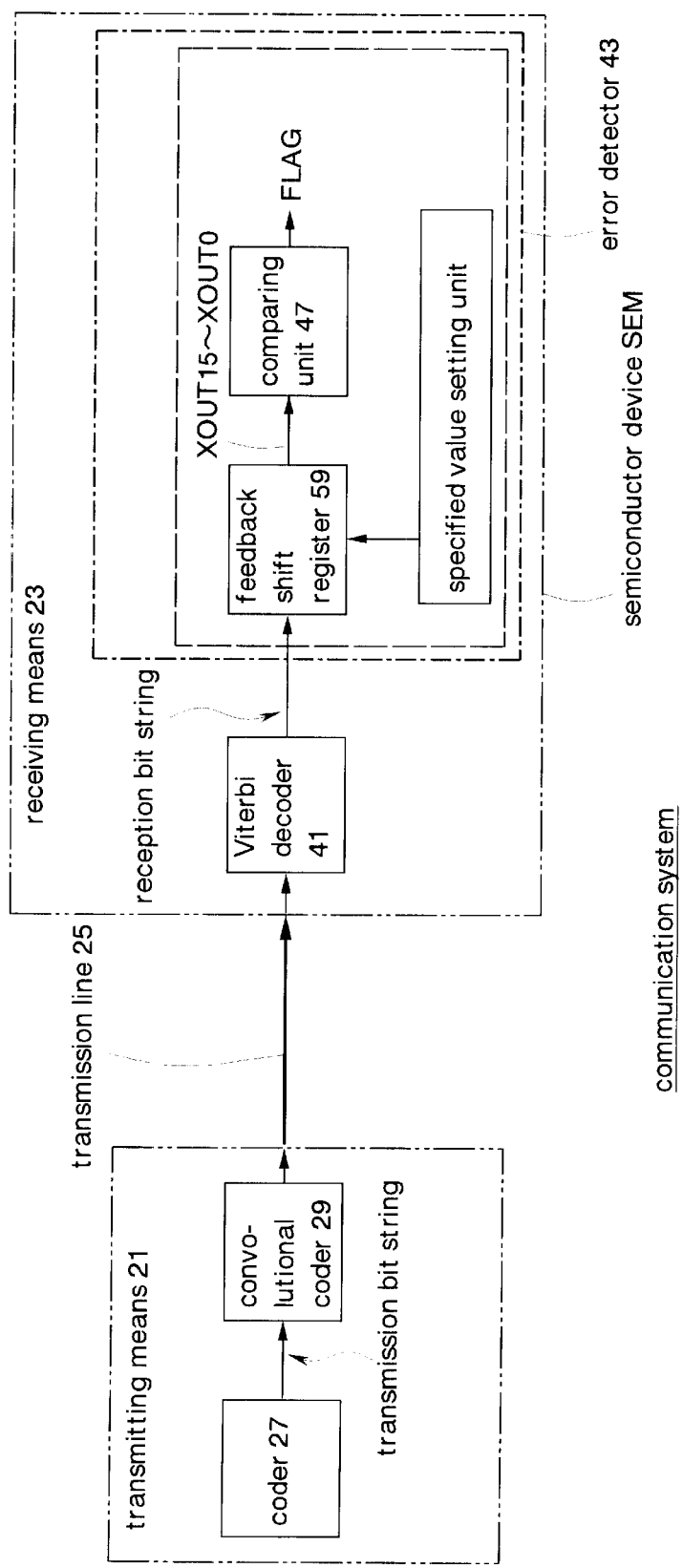
FIG. 19 is a block diagram showing the basic principle of an error detector according to the third embodiment of the present invention.

FIG. 19 is a block diagram showing the basic principle of an error detector according to a third embodiment of the present invention. In the present embodiment, the error detector 43 comprises specified value setting unit for setting a specified value to a feedback shift register 59. As for the components other than the specified value setting unit, they are the same as in the first embodiment described above.

Figure 20:
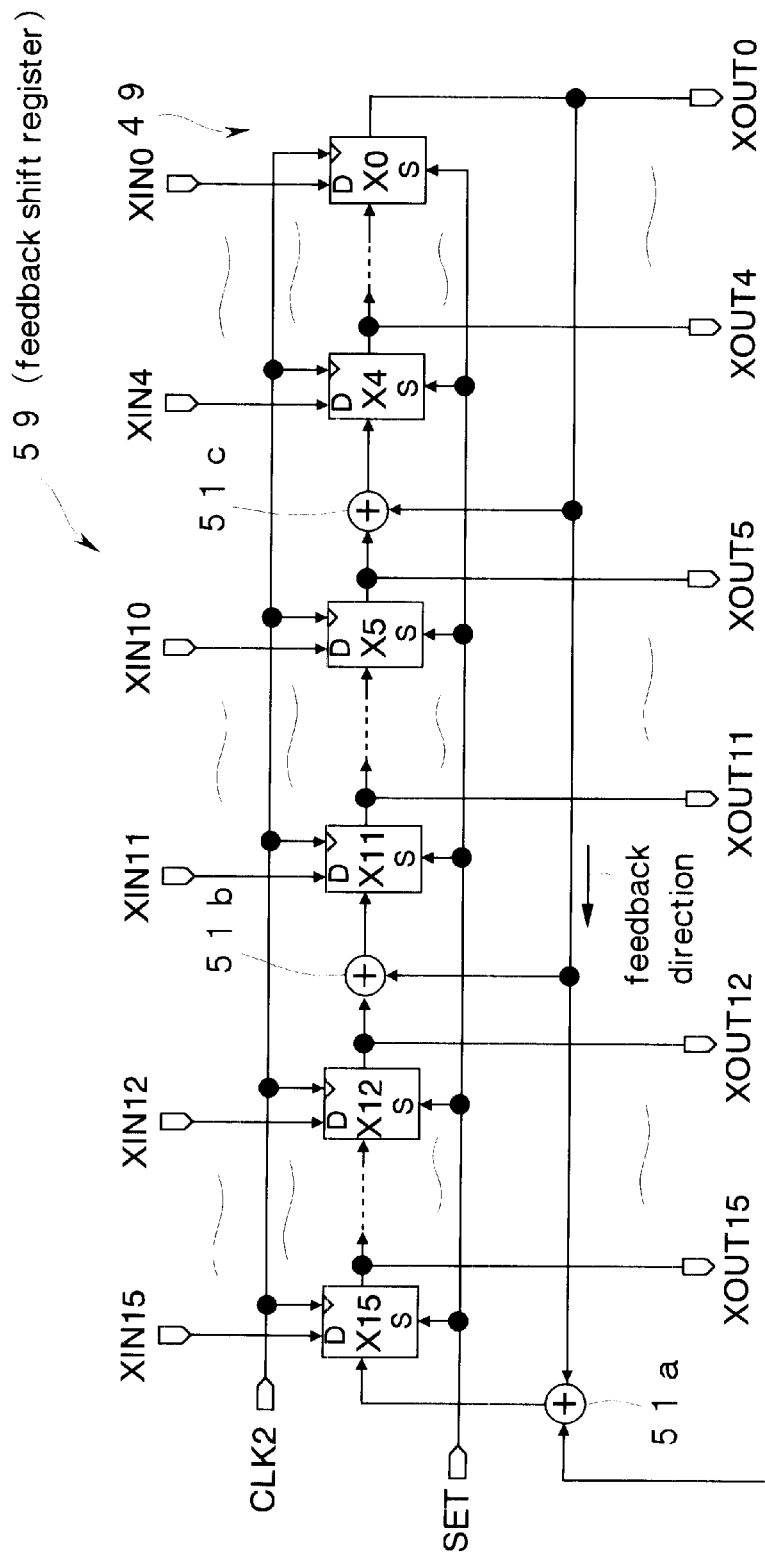
FIG. 20 is a circuit diagram showing the error detector according the third embodiment.

FIG. 20 depicts in detail the feedback shift register 59 at the receiver 23 of the error detector according to the third embodiment. The feedback shift register 59 is a circuit to be used in place of the feedback shift register 45 according to the first embodiment. As for the components other than the feedback shift register 59, they are the same as in the first embodiment.

In the present embodiment, the F/F circuits X15 to X0 of the feedback shift register 59 have respective set terminals S and respective input terminals D. A set signal SET from the specified value setting unit is connected to each of the set terminals S. Input signals XIN15 to XIN0 from the setting unit are connected to the respective input terminals D of the F/F circuits X15 to X0. Each of the F/F circuits X15 to X0 has the function of receiving the value inputted to the input terminal D in synchronization with the tailing edge of the set signal SET.

In the present embodiment, the switch S4 used in the first embodiment is not provided in the feedback shift register 59. In other words, the output signal XOUT0 of the F/F circuit X0, the EOR circuits 51b and 51c, and the EOR circuit 51a are constantly kept in the state where a feedback operation is enabled.

Figure 21:
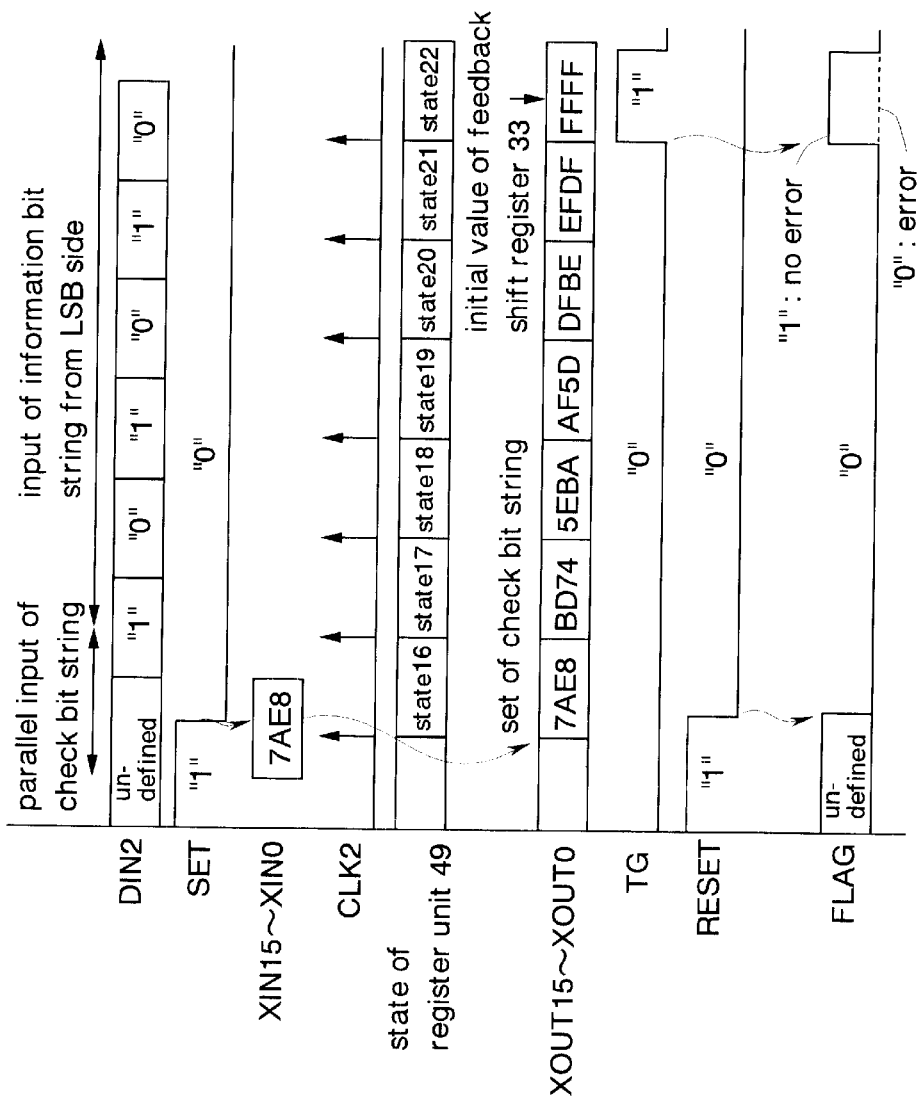
FIG. 21 is a timing chart showing the operation of the feedback shift register at the receiver shown in FIG. 20.

FIG. 21 shows operation timing for the feedback shift register 59 and the comparing unit 47. The present embodiment performs the error detection by merely causing transitions from "STATE 16" to "STATE 22" of the first embodiment in the feedback shift register 59.

In "STATE 16", the error detector 43 changes the set signal SET from "1" to "0". The F/F circuits X15 to X0 of the feedback shift register 59 are loaded with the respective values set to the input signals XIN15 to XIN0 in synchronization with the tailing edge of the set signal SET. To the input signals XIN15 to XIN0, the check bit string "0111 1010 1110 1000" (7AE8 in hexadecimal notation) has been set preliminarily.

In "STATE 16", the error detector 43 changes the reset signal RESET from "1" to "0", resets the flip-flop circuit 55, and changes the error detecting signal FLAG to "0".

The operation timing for the feedback shift register 59 and the comparing unit 47 in "STATE 17" through "STATE 22" are the same as in the first embodiment.

The error detector according to the present embodiment can also achieve the same effects as achieved by the first embodiment described above.

Since the present embodiment has provided the F/F circuits X15 to X0 of the feedback shift register 59 with the respective set terminals S and the respective input terminals D, the check bit string can directly be inputted in parallel to the F/F circuits X15 to X0. This obviates the necessity for the process performed in "STATE 0" through "STATE 15" in the first embodiment and greatly reduces the processing time in the error detector 43 compared with that of the error detector in the prior art.

Figure 22:
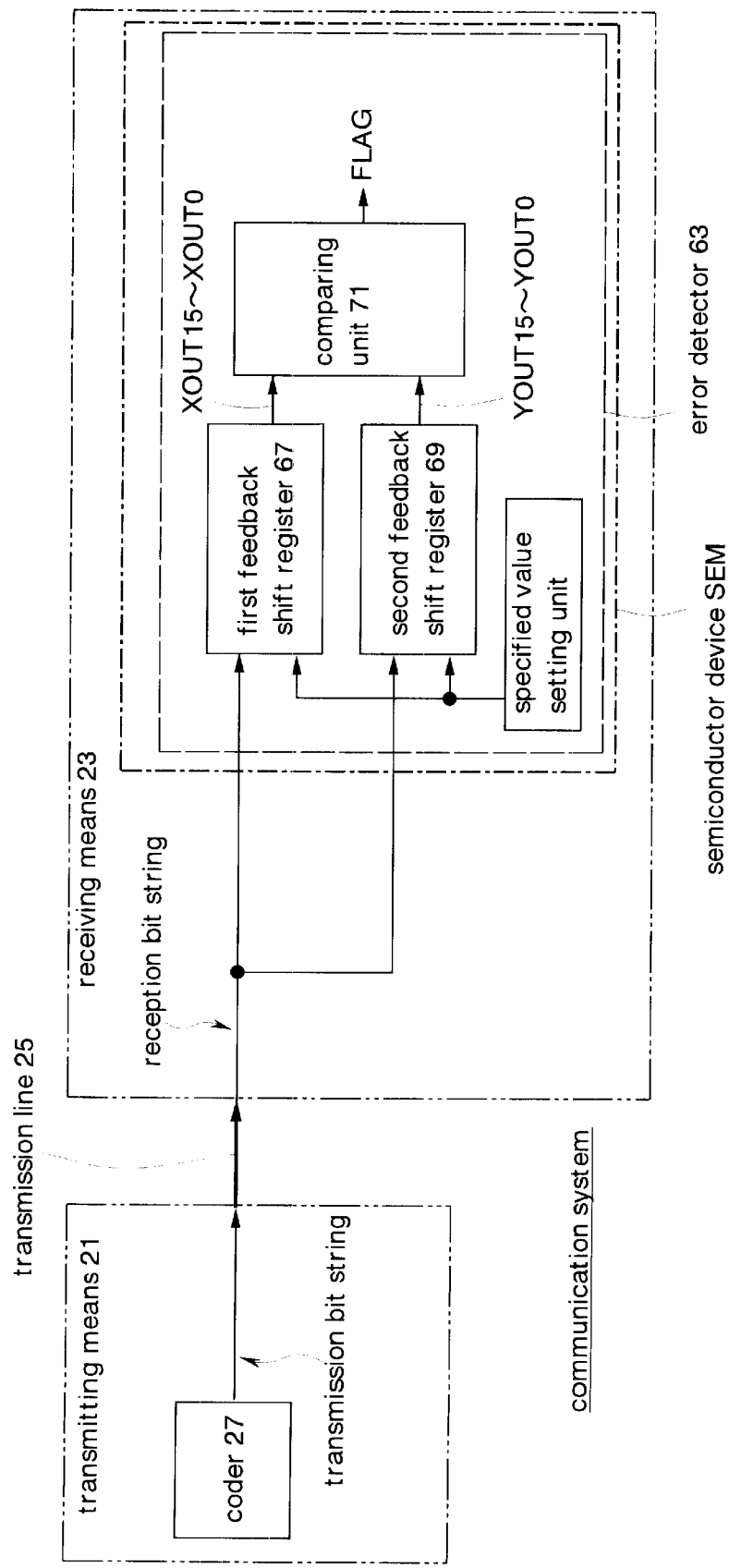
FIG. 22 is a block diagram showing the basic principle of an error detector, a semiconductor device comprising the error detector, and an error detection method according to a fourth embodiment of the present invention.

FIG. 22 is a block diagram showing the basic principle of an error detector, a semiconductor device comprising the error detector, and an error detection method according to the fourth embodiment of the present invention. Transmitting means and receiving means corresponding to the transmitter 21 and the receiver 23 are connected to each other via a transmission line corresponding to the radio transmission line 25. The transmitting means, the receiving means, and the transmission line constitute the communication system, similarly to the first embodiment.

The transmitting means comprises the coder 27. The receiving means comprises an error detector 63 composed of, e.g., the semiconductor device SEM.

The error detector 63 comprises the first feedback shift register 67, the second feedback shift register 69, specified value setting unit for setting the first and second shift registers 67 and 69 to a specified value, and the comparing unit 71.

The transmitting means has the function of generating the transmission bit string by means of the coder 27 and outputting the generated transmission bit string onto the transmission line.

The receiving means has the function of receiving the reception bit string at the first and second feedback shift registers 67 and 69 and detecting errors in the reception bit string. The error detector 43 performs the error detection by comparing respective remainders obtained by the first and second feedback shift registers 67 and 69 by using the comparing unit 71. The comparing unit 71 outputs the error detecting signal FLAG when the result of the comparison indicates a dissimilarity therebetween.

Figure 23:
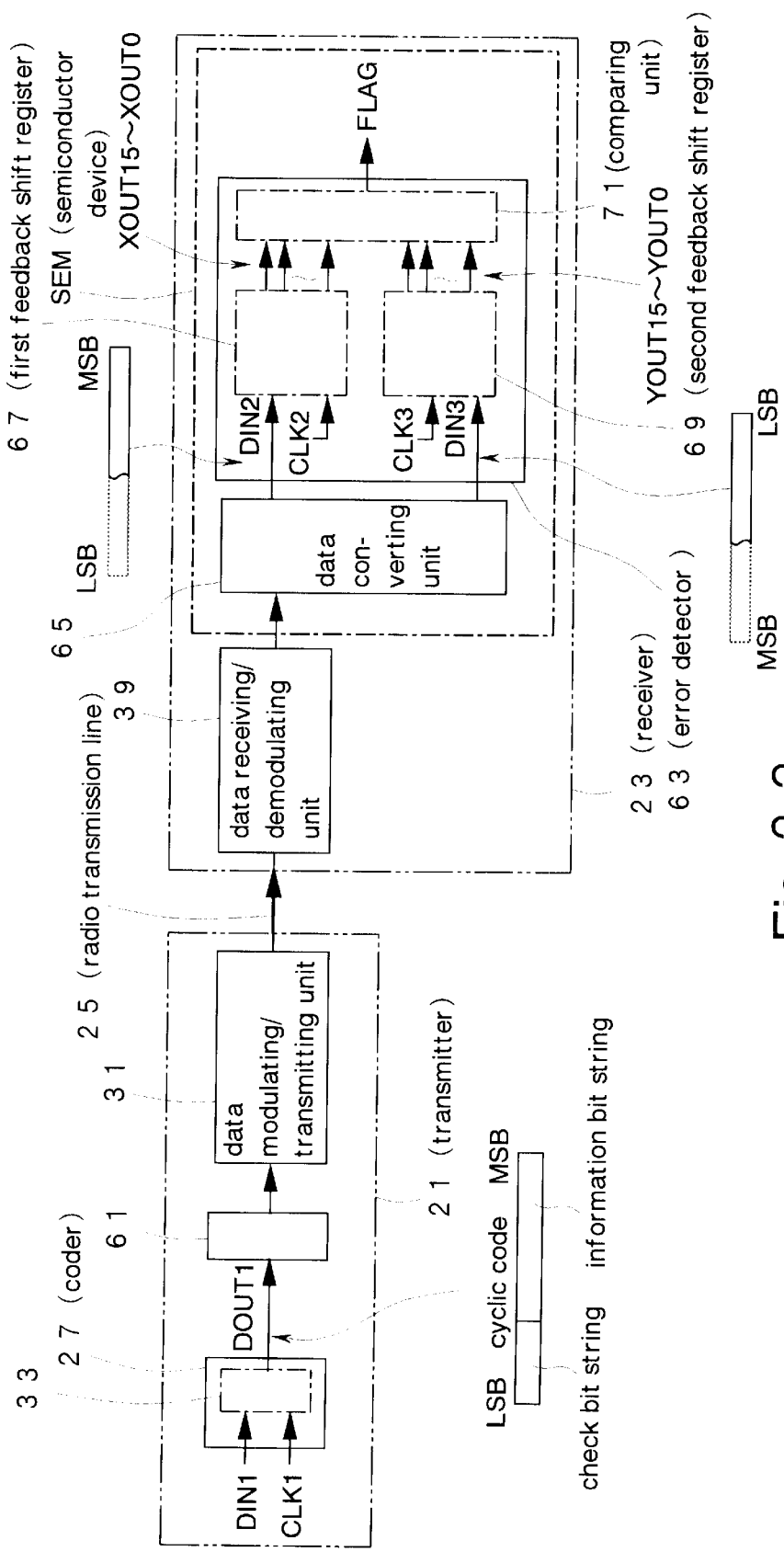
FIG. 23 is a block diagram showing the error detector, the semiconductor device comprising the error detector, and the error detection method according to the fourth embodiment.

FIG. 23 shows the error detector, the semiconductor device comprising the error detector, and the error detection method according to the fourth embodiment. As for the same components as used in the first embodiment, they are designated by similar reference numerals.

In the communication system, the transmitter 21 has the coder 27 composed of the feedback shift register 33, a data converting unit 61, and the data modulating/transmitting unit 31. The data converting unit 61 has the function of performing a bit rearrangement process whereby the sequence of bits in the cyclic code generated by the feedback shift register 33 is rearranged. The receiver 23 has the data receiving/demodulating unit 39, a data converting unit 65, and the error detector 63. The data converting unit 65 has the function of restoring data obtained through the bit rearrangement process performed by the data converting unit 61 at the transmitter 21 to the original cyclic code.

The error detector 63 has the first and second feedback shift registers 67 and 69, and the comparing unit 71.

In the present embodiment, the error detector 63 has been formed in the semiconductor SEM such as the CODEC LSI (Coder Decoder LSI).

Figure 24:
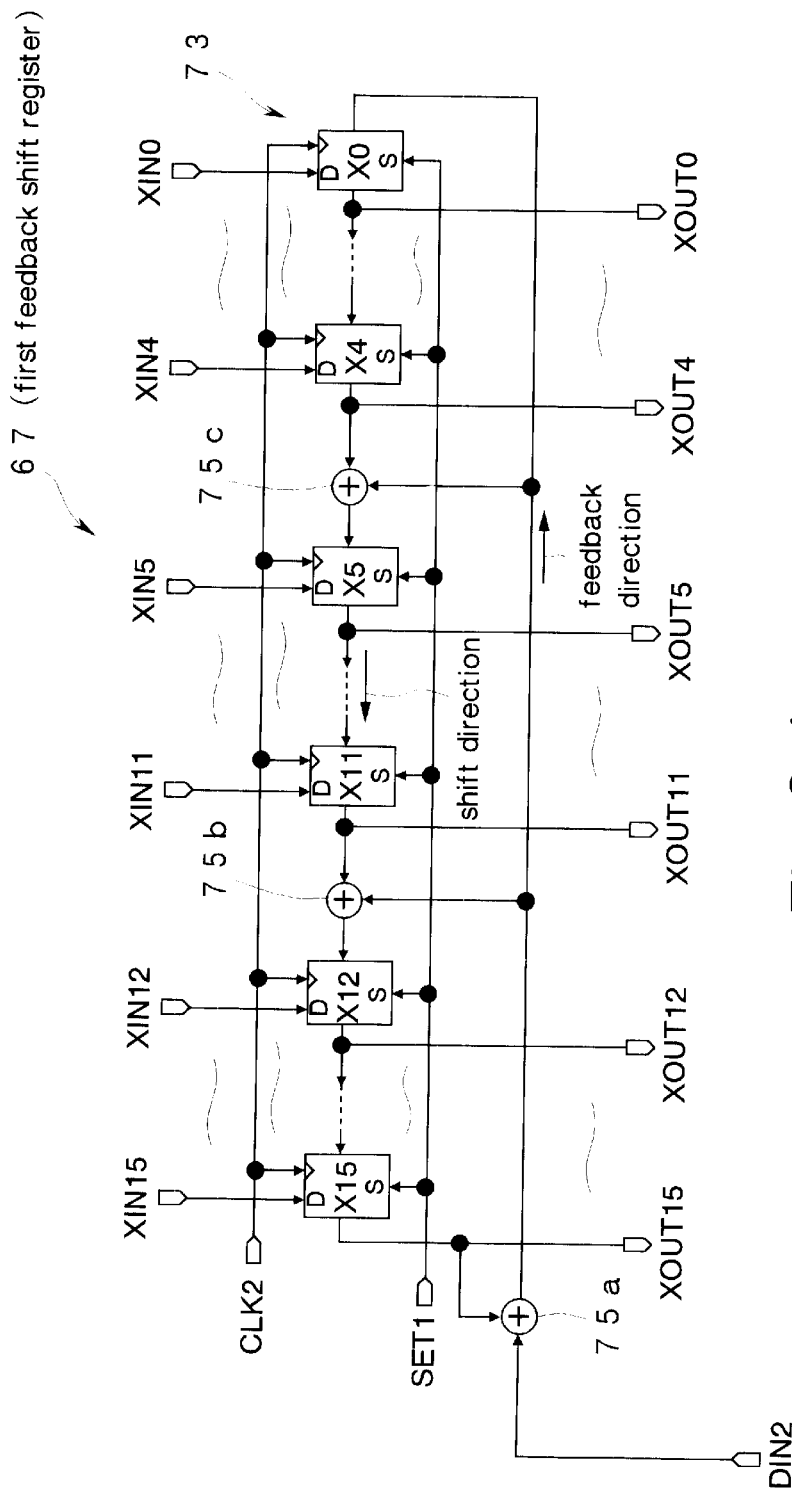
FIG. 24 is a circuit diagram showing the first feedback shift register of FIG. 23.

As shown in FIG. 24, the first feedback shift register 67 has a register unit 73 consisting of sixteen flip-flop circuits X15 to X0 (hereinafter referred to as F/F circuits X15 to X0) connected in cascade, and three EOR circuits 75a, 75b and 75c each for performing a specified operation.

The first feedback shift register 67 has the same dividing function as the feedback shift register 33 at the transmitter 21, while the F/F circuits X15 to X0 and the EOR circuits 75a, 75b and 75c are in the same connecting relations as in the feedback shift register 33.

The F/F circuits X15 to X0 of the first feedback shift register 67 have the respective set terminals S and the respective input terminals D for setting a specified value to each of the F/F circuits X15 to X0, and the respective output signals XOUT15 to XOUT0 for outputting the respective values held by the F/F circuits X15 to X0 to the outside. A set signal SET1 from the specified value setting unit is connected to each of the set terminals S. The input signals XIN15 to XIN0 from the setting unit are connected to the respective input terminals D of the F/F circuits X15 to X0. Each of the F/F circuits X15 to X0 has the function of receiving the value inputted to the input terminal D in synchronization with the tailing edge of the set signal SET1.

Figure 25:
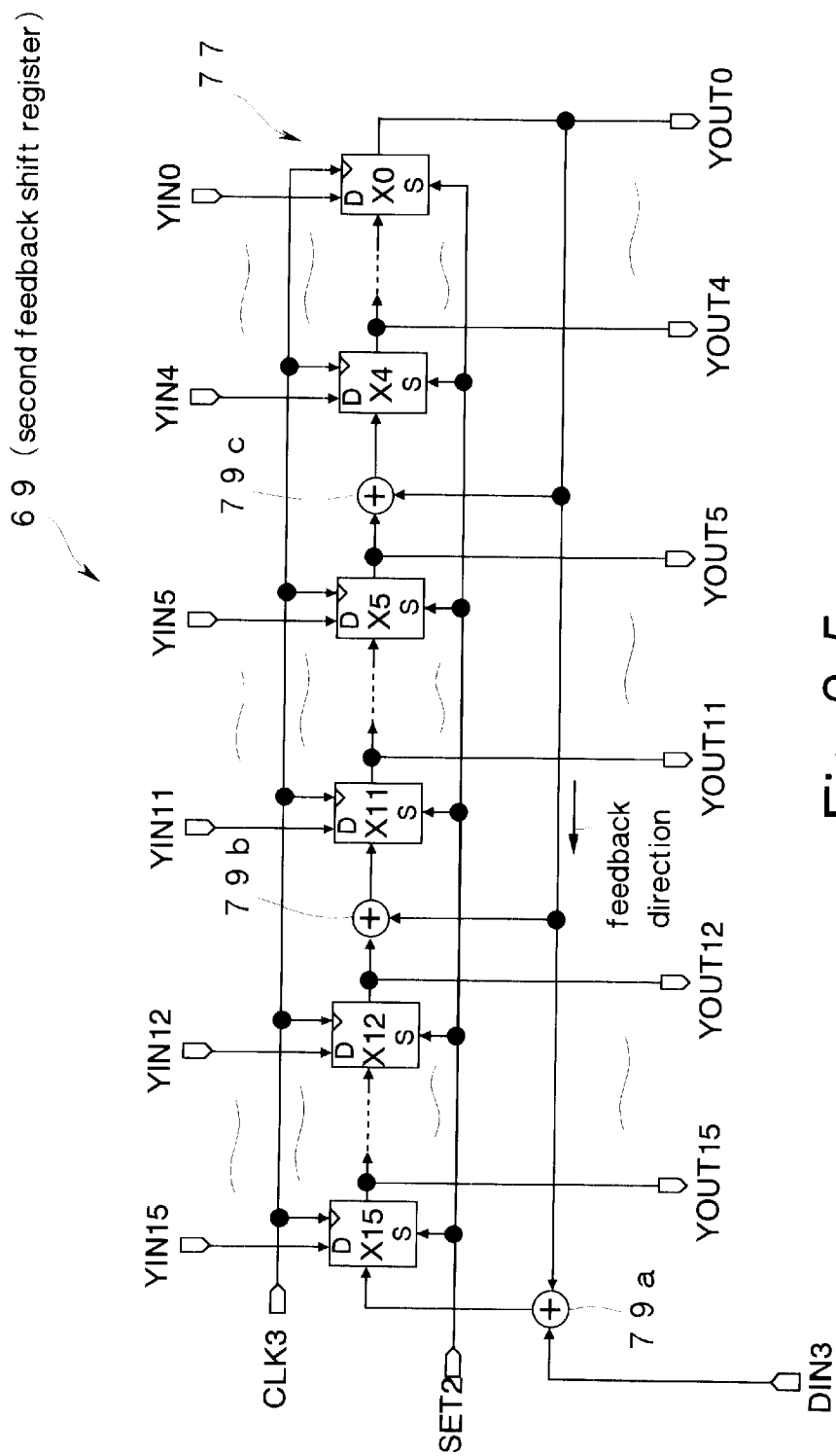
FIG. 25 is a circuit diagram showing the second feedback shift register of FIG. 23.

As shown in FIG. 25, the second feedback shift register 69 has a register unit 77 consisting of sixteen F/F circuits X15 to X0 connected in cascade, and three EOR circuits 79a, 79b and 79c each for performing a specified operation.

The second feedback shift register 69 has the same dividing function as the feedback shift register 45 according to the first embodiment, while the F/F circuits X15 to X0, and the EOR circuits 79a, 79b and 79c are in the same connecting relations as in the feedback shift register 45.

The F/F circuits X15 to X0 of the second feedback shift register 69 have the respective set terminals S and the respective input terminals D for setting a specified value to each of the F/F circuits X15 to X0, and the respective output signals YOUT15 to YOUT0 for outputting the respective values held by the F/F circuits X15 to X0 to the outside. A set signal SET2 from the specified value setting unit is connected to each of the set terminals S. The input signals YIN15 to YIN0 from the setting unit are connected to the respective input terminals D of the F/F circuits X15 to X0. Each of the F/F circuits X15 to X0 has the function of receiving the value inputted to the input terminal D in synchronization with the tailing edge of the set signal SET2.

Figure 26:
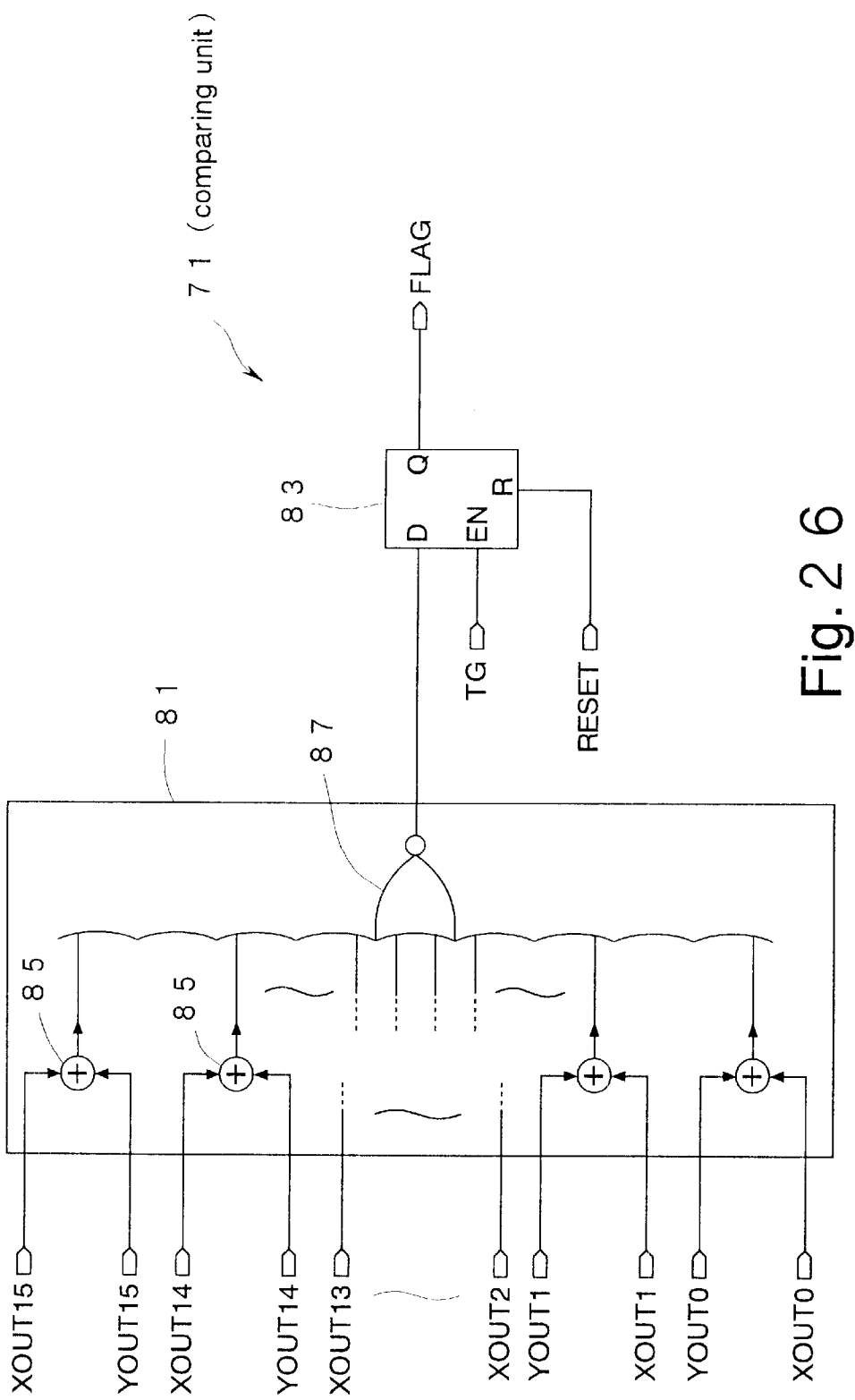
FIG. 26 is a circuit diagram showing a comparing unit of FIG. 23.

As shown in FIG. 26, the comparing unit 71 is composed of a comparing circuit 81 and a flip-flop circuit 83. The comparing circuit 81 is composed of sixteen EOR circuits 85 and a 16-input NOR circuit 87. The output signals XOUT15 to XOUT0 of the feedback shift register 67 and the output signals YOUT15 to YOUT0 of the feedback shift register 69 are connected to the respective two input terminals of the EOR circuits 85 such that the output signals with the same appended numbers are connected in pairs. The respective outputs of the EOR circuits 85 are connected to the respective input terminals of the NOR circuit 87.

The flip-flop circuit 83 used in the present embodiment is identical to the flip-flop circuit 55 of the comparing unit 47 used in the first embodiment and therefore has the input terminal D, the enable terminal EN, the reset terminal R, and the output terminal Q. The trigger signal TG is connected to the enable terminal EN of the flip-flop circuit 83. The reset signal RESET is connected to the reset terminal R of the flip-flop circuit 83. The error detecting signal FLAG for outputting error data is outputted from the output terminal Q of the flip-flop circuit 83.

The output of the NOR circuit 87 is connected to the input terminal D of the flip-flop circuit 83.

In the communication system shown in FIG. 23, the detection of errors in data transmitted from the transmitter 21 is performed as follows. By way of example, the following description will be given of the case where a 6-bit information bit string of "010101" is transmitted.

First, the coder 27 at the transmitter 21 generates the cyclic code "01 0101 0111 1010 1110 1000" identical to that used in the first embodiment and outputs it to the data converting unit 61 via the output signal DOUT1.

The data converting unit 61 performs a bit rearrangement process with respect to the sequence of bits in the inputted cyclic code under a given rule. The data converting unit 61 performs the bit rearrangement process such that the cyclic code after the bit rearrangement process is restored to the original cyclic code both from the MSB side and from the LSB side in the process performed by the data converting unit 65, which will be described later.

The cyclic code after the bit rearrangement process is outputted, by the data modulating/transmitting unit 31, the radio transmission line 25, and the data receiving/demodulating unit 39, to the data converting unit 65 at the receiver 23.

The data converting unit 65 performs the process of sequentially restoring the cyclic code after the bit rearrangement process from the MSB side and from the LSB side to the original cyclic code.

The data converting unit 65 sequentially outputs the cyclic code restored from the MSB side to the first feedback shift register 67 of the error detector 63, while sequentially outputting the cyclic code restored from the LSB side to the second feedback shift register 69 of the error detector 63.

FIG. 27 shows the respective states of the F/F circuits X15 to X0 when the first feedback shift register 67 operates upon receipt of the cyclic code transmitted from the data converting unit 65.

At this stage, each of the F/F circuits X15 to X0 of the first feedback shift register 67 has preliminarily been set to "1" in response to the set signal SET1 under the control of the error detector 63 of FIG. 24 via the input signals XIN15 to XIN0.

The F/F circuits X15 to X0 of the first feedback shift register 67 undergo transitions from "STATE 0" to "STATE 11" in synchronization with the clock signal CLK2. In the drawing, "STATE 12" through "STATE 22" are the states of the F/F circuits X15 to X0 of the first feedback shift register 67 when it is assumed that the cyclic code has entirely been inputted from the MSB side, which are not the states used in the present embodiment.

The respective values held by the F/F circuits X15 to X0 of the first feedback shift register 67 in "STATE 11" are outputted to the comparing circuit 81 via the output signals XOUT15 to XOUT0.

Figure 28:
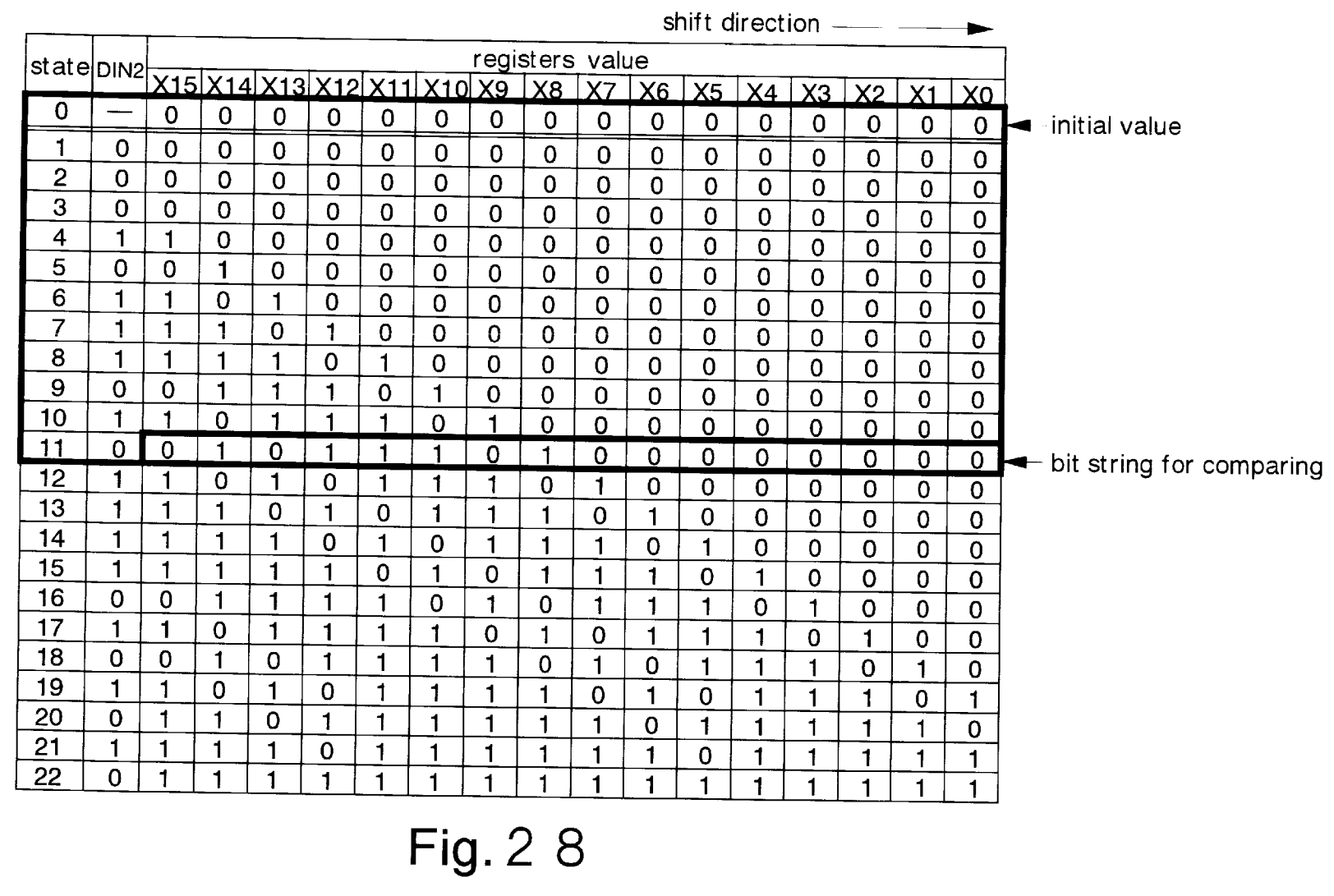

FIG. 28 shows the respective states of the F/F circuits X15 to X0 when the second feedback shift register 69 operates upon receipt of the cyclic code transmitted from the data converting unit 65.

At this stage, each of the F/F circuits X15 to X0 of the second feedback shift register 69 has preliminarily been set to "0" in response to the set signal SET2 under the control of the error detector 63 of FIG. 25 by means of the input signals YIN15 to YIN0.

The F/F circuits X15 to X0 of the second feedback shift register 69 undergo transitions from "STATE 0" to "STATE 11" in synchronization with the clock signal CLK2. In the drawing, "STATE 12" through "STATE 22" are the states of the F/F circuits X15 to X0 of the second feedback shift register 69 when it is assumed that the cyclic code has entirely been inputted from the MSB side, which are not the states used in the present embodiment.

It is to be noted that "STATE 0" to "STATE 22" in FIG. 27 coincide with "STATE 22" to "STATE 0" in FIG. 28, respectively. Hence, the state transitions in the second feedback shift register 69 are the same as the transitions from "STATE 22" to "STATE 0" in FIG. 27.

The respective values held by the F/F circuits X15 to X0 of the second feedback shift register 69 in "STATE 11" are outputted to the comparing circuit 81 of FIG. 26 via the output signals YOUT15 to YOUT0.

The comparing circuit 81 receives the output signals XOUT15 to XOUT0 and the output signals YOUT15 to YOUT0 at the individual EOR circuits 85 and outputs the results of the operations to the NOR circuit 87. Since the output signals XOUT15 to XOUT0 are in perfect agreement with the output signals YOUT15 to YOUT0 in the example described above, each of the EOR circuits 85 outputs "0".

The NOR circuit 87 receives "0" from each of the EOR circuits 85 to perform the logic operation and outputs "1" to the flip-flop circuit 83.

The flip-flop circuit 83 receives "1" outputted from the NOR circuit 87 in synchronization with the trigger signal TG and outputs "1" to the error detecting signal FLAG. The error detector 63 detects the value "1" of the error detecting signal FLAG and judges the received data to not be having any errors. Conversely, the error detector 63 judges the received data to be erroneous when it detects the value "0" of the error detecting signal FLAG outputted from the flip-flop circuit 83. The receiver 23 receives the judgment and gives a retransmission instruction to the transmitter 21.

Thus, the error detector 63 detects errors that have occurred during data transmission by shifting each of the first and second feedback shift registers 67 and 69 from "STATE 0" to "STATE 11" and judging whether or not the respective values held by the F/F circuits X15 to X0 in "STATE 11" are the same.

It is to be noted that the trigger signal TG and the reset signal RESET are under the control of the error detector 63. The flip-flop circuit 83 has been reset in response to the reset signal RESET before it receives "1" outputted from the NOR circuit 87, while "0" is outputted from the error detecting signal FLAG at this time.

The error detector and the semiconductor device according to the present embodiment can also achieve the same effects as achieved by the first to third embodiments described above.

In the present embodiment, moreover, the shift direction and the feedback direction in the first feedback shift register 67 are the same as the shift direction and the feedback direction in the feedback shift register 33 at the transmitter 21 conforming to the generator polynomial $X^{16}+X^{12}+X^5+1$. On the other hand, a shift direction and a feedback direction in the second feedback shift register 69 are opposite to the shift direction and feedback direction in the feedback shift register 33 at the transmitter 21 conforming to the generator polynomial $X^{16}+X^{12}X^5+1$. Accordingly, the cyclic code can be inputted to the first feedback shift register 67 in the same order in which it was generated at the transmitter 21 (from the MSB side). On the other hand, the cyclic code can be inputted to the second feedback shift register 69 in reverse order to one which it was generated at the transmitter 21 (from the LSB side). In short, shift operations performed in the first feedback shift register 67 changes the value of the first register unit 73 in each state in the same direction as when the feedback shift register 33 at the transmitter 21 performs shift operations. On the other hand, shift operations performed in the second feedback shift register 69 changes the value of the second register unit 77 in each state in the direction that returns the check bit string generated by the feedback shift register 33 at the transmitter 21 to the initial value. Hence, errors in the reception bit string can be detected by causing each of the first and second feedback shift registers 67 and 69 to perform a specified number of shift operations, comparing the respective values of the first and second register units 73 and 77, and judging whether or not the two values are in agreement.

In the communication system thus constructed, the transmission bit string generated by the coder 27 at the transmitter 21 is received as the reception bit string at the receiver. The reception bit string is inputted to the first feedback shift register 67 in the same order in which it was generated by the coder 27, while it is inputted to the second feedback shift register 69 in reverse order to it was generated by the coder 27. Hence, errors in the reception bit string can be detected by examining whether or not the value of the first register unit 73 of the first feedback shift register 67 agrees with the value of the second register unit 77 of the second feedback shift register 69.

Figure 29:
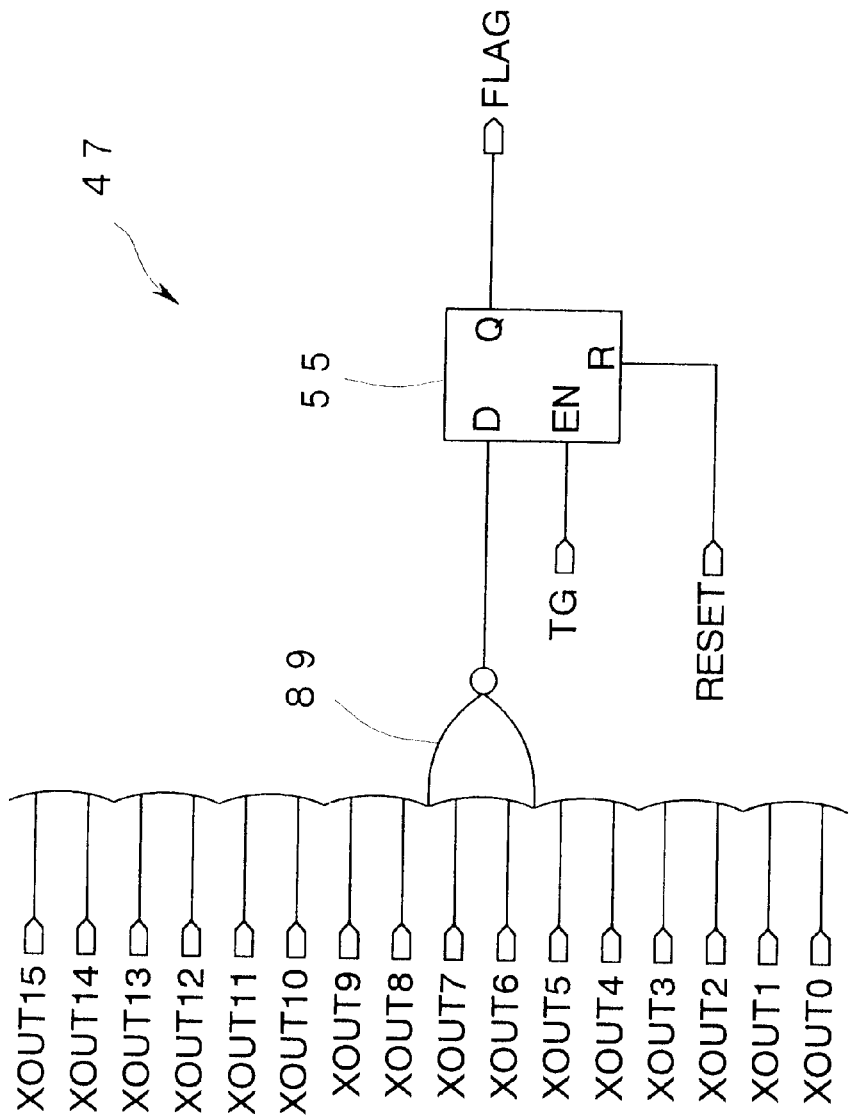
FIG. 29 is a circuit diagram showing an example in which the comparing unit shown in the first embodiment is formed of a NOR circuit.
Figure 30:
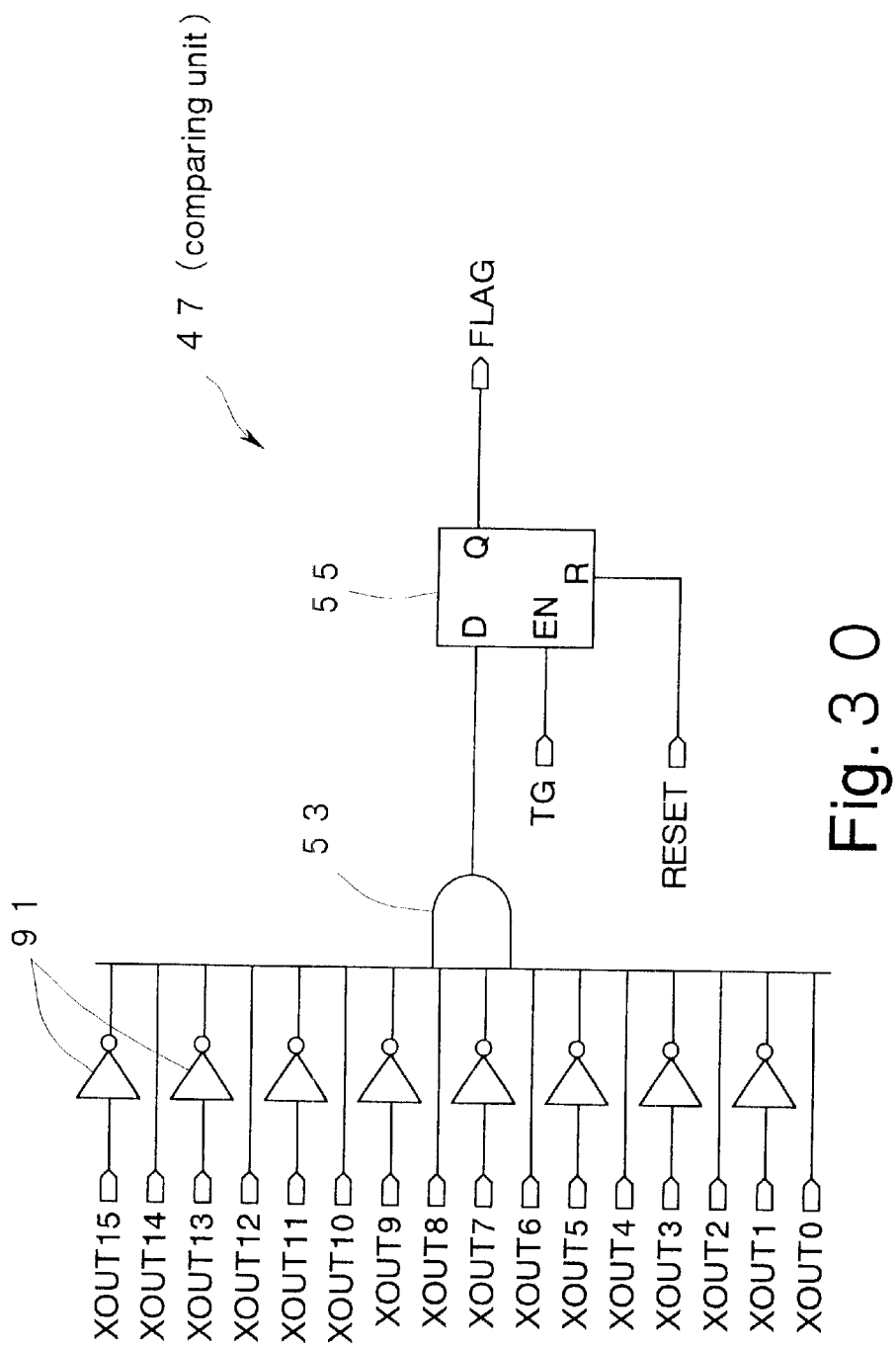
FIG. 30 is a circuit diagram showing an example in which the comparing unit shown in the first embodiment is composed of an inverter circuit and an AND circuit.

Although the first embodiment has described the example in which all the initial values in the feedback shift register 33 at the transmitter 21 are set to "1" and the comparing unit 47 is provided with the AND circuit 53, the present invention is not limited to such an embodiment. For example, it is also possible to set all the initial values in the feedback shift register 33 at the transmitter 21 to "0" and form a 16-input NOR circuit 89 in the comparing unit 47, as shown in FIG. 29. Alternatively, the initial values in the feedback shift register 33 at the transmitter 21 may be set to "5555" in hexadecimal notation and the odd-numbered output signals XOUT15, XOUT13, . . . XOUT1 may be connected alternately to the AND circuit 53 of the comparing unit 47 via inverter circuits 91, as shown in FIG. 30.

Figure 31:
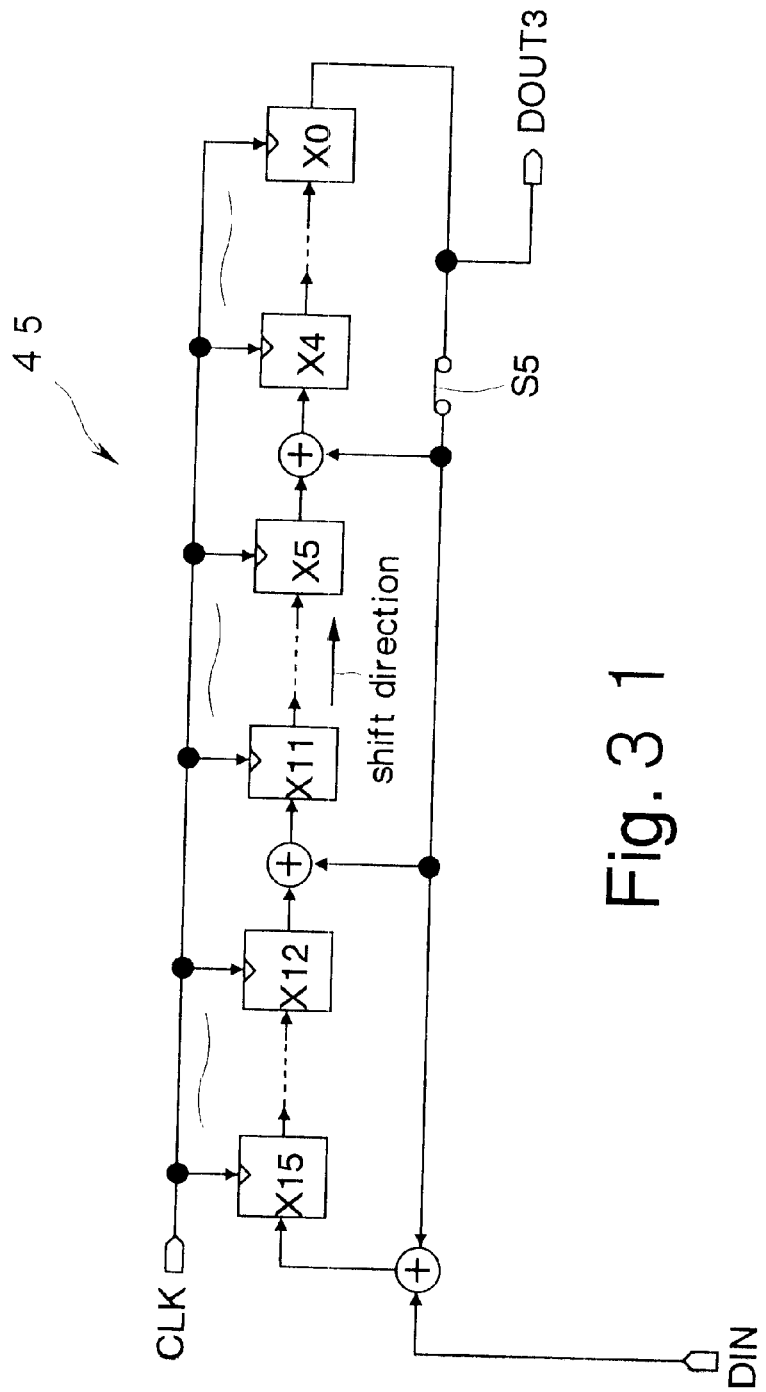
FIG. 31 is a circuit diagram showing another example of the feedback shift register shown in the first embodiment.

Although the first embodiment has described the example in which the output signals XOUT15 to XOUT0 are outputted from the respective flip-flops X15 to X0 of the feedback shift register 45, the present invention is not limited to such an embodiment. For example, a switch S5 may be disposed between the output DOUT3 of the F/F circuit X0 and each of the EOR circuits 51a, 51b, and 51c, as shown in FIG. 31. In this case, the respective values held by the flip-flops X15 to X0 can be outputted bit by bit via the output signal DOUT3 by operating the feedback shift register 45 with the switch S5 kept open.

Although the first embodiment has described the example in which the present invention is applied to the error detection performed in the receiver 23 comprising the Viterbi decoder 31, the present invention is not limited to such an embodiment. The present invention is applicable to any receiver compatible with the specifications under which the cyclic code is inputted to the error detector 43 in reverse order to one which it was generated at the transmitter 21.

Although the first and fourth embodiments have described the cases where the error detectors 43 and 65 have been formed in the semiconductor device SEM such as the channel CODEC LSI, the present invention is not limited to such an embodiment. It is also possible to perform the error detection by using a semiconductor device such as a DSP (Digital Signal Processor) or CPU (Central Processing Unit) and using a general-purpose circuit within such a semiconductor device under a program. In this case, the semiconductor device performs the error detection by executing a division procedure under the program. Data necessary for the division procedure such as a divisor, a dividend, and a remainder is held in a buffer unit such as a general-purpose register.

Hence, errors in the reception bit string can be detected based on the remainder from the division of the reception bit string data by the generator polynomial, which is executed by the semiconductor device under the program in reverse order to the transmission bit string was generated by using the generator polynomial at the transmitter.

The reception bit string can be judged to be erroneous when the remainder from the division procedure executed by the semiconductor device under the program and the predetermined expected value are compared and the result of the comparison indicates a dissimilarity therebetween. The processing time required for the error detection can be reduced by initializing the buffer unit for receiving the remainder from the division procedure to "0" before the division procedure is executed by the semiconductor device under the program. Alternatively, the processing time required for the error detection can be reduced by setting the buffer unit for receiving the remainder from the division procedure to a specified value before the division procedure is executed by the semiconductor device under the program.

Although the fourth embodiment has described the example in which the error detection is performed by shifting each of the first and second feedback shift registers 67 and 69 from "STATE 0" to "STATE 11" and comparing the respective values held by the F/F circuits X15 to X0 in "STATE 11", the present invention is not limited to such an embodiment. For example, the error detection may also be performed by shifting the first feedback shift register 67 to "STATE 15" and the second feedback shift register 69 to "STATE 7" and comparing the first feedback shift register 67 in "STATE 15" and the second feedback shift register 69 in "STATE 7". In short, the first feedback shift register 67 according to such an embodiment undergoes transitions from "STATE 0" to "STATE 22" in FIG. 27. The second feedback shift register 69 undergoes transitions from "STATE 22" to "STATE 0" in FIG. 27. Consequently, the respective "states" of the first and second feedback shift registers 67 and 69 come to an agreement when the sum of the number of "STATE" transitions in the first feedback shift register 67 and the number of "STATE" transitions in the second feedback shift register 69 becomes "22". Therefore, the error detection can be performed by comparing the first and second feedback shift registers 67 and 69 when the respective "states" thereof are in agreement.

Hence, the processing time required for the error detection can be reduced most efficiently by determining which "STATE" of the two feedback shift registers to bring an agreement to, depending on the respective bit lengths (number of "STATE" transitions) of the cyclic code converted by the data converting unit 39 from the MSB side and the cyclic code converted thereby from the LSB side.

What is claimed is:

1. An error detector comprising first and second feedback shift registers each for dividing a reception bit string by a generator polynomial, a shift direction and a feedback direction in said first feedback shift register being the same as a shift direction and a feedback direction at a transmitter in generating a transmission bit string by using a specified generator polynomial, a shift direction and a feedback direction in said second feedback shift register being opposite to the shift direction and feedback direction at the transmitter in generating said transmission bit string by using said specified generator polynomial, the detector detecting errors in said reception bit string based on the remainders obtained by said first and second feedback shift registers respectively.

2. The error detector according to claim 1, wherein said first feedback shift register comprises:

a first register unit having the number of stages with the highest degree of said specified generator polynomial;

a first operation unit for performing an operation between an input value to said first register unit and an output value from the final stage and outputting the result to the first stage; and a second operation unit for performing an operation between the result of the operation performed by said first operation unit and an output value from the stage which is smaller by one ordinal number than the degree of each of the terms other than the highest-degree and lowest-degree terms out of said specified generator polynomial and outputting each result to the subsequent stage and said second feedback shift register comprises:

a second register unit having same number of stages with the highest degree of said specified generator polynomial;

a third operation unit for performing an operation between an input value to said second register unit and an output value from the final stage and outputting the result to the first stage; and a fourth operation unit for performing an operation between the output value from the final stage and an output value from the stage corresponding to the degree of each of the terms other than the highest-degree and lowest-degree terms out of said specified generator polynomial and outputting the result of each operation to the subsequent stage.

3. The error detector according to claim 1 or 2, further comprising a comparing unit for comparing said remainders obtained by said first and second feedback shift registers respectively, and outputting error data indicative of a dissimilarity as a result of the comparison.

4. The error detector according to claim 1, further comprising a specified value setting unit for setting a specified value to each of said first and second feedback shift registers.

5. A semiconductor device comprising an error detector as recited in claims 1 or 2.

6. An error detection method comprising the steps of inputting a reception bit string to a division procedure using a specified generator polynomial as a divisor and detecting errors in said reception bit string based on a remainder from said division procedure, wherein said method further comprises first and second division procedures each for dividing said reception bit string by said generator polynomial, the inputting of said reception bit string to said first division procedure is performed in the same order in which a transmission bit string is generated at a transmitter by using said generator polynomial, the inputting of said reception bit string to said second division procedure is performed in the reverse order to one in which said transmission bit string is generated at said transmitter by using said generator polynomial, and respective remainders from said first and second division procedure are compared with each other and said reception bit string is judged to be erroneous when the result indicates a dissimilarity therebetween.

7. The error detection method according to claim 6, wherein each of a first buffer unit for receiving said remainder from said first division procedure and a second buffer unit for receiving said remainder from said second division procedure is set to a specified value before said first and second division procedures are executed.

* * * * *